United States Patent [19]
Bodenhausen et al.

[11] Patent Number: 5,196,795
[45] Date of Patent: Mar. 23, 1993

[54] METHOD FOR SELECTIVE EXCITATION OF NMR SIGNALS

[75] Inventors: Geoffrey Bodenhausen, Pully; Lyndon Emsley, Lausanne, both of Switzerland

[73] Assignee: Spectrospin AG, Fallanden, Switzerland

[21] Appl. No.: 573,050
[22] PCT Filed: Jul. 25, 1990
[86] PCT No.: PCT/EP89/01360
§ 371 Date: Jul. 24, 1990
§ 102(e) Date: Jul. 24, 1990
[87] PCT Pub. No.: WO90/06523
PCT Pub. Date: Jun. 14, 1990

[30] Foreign Application Priority Data
Nov. 25, 1988 [DE] Fed. Rep. of Germany ....... 3839820

[51] Int. Cl.⁵ .............................................. G01R 33/20
[52] U.S. Cl. ..................................................... 324/309
[58] Field of Search ............... 324/300, 307, 308, 311, 324/312, 313, 309, 314

[56] References Cited
U.S. PATENT DOCUMENTS
4,502,008  2/1985  Ohuchi ................................ 324/311

FOREIGN PATENT DOCUMENTS
0109633  11/1983  European Pat. Off. .
3517812   5/1985  Fed. Rep. of Germany .
2101334   6/1982  United Kingdom .

OTHER PUBLICATIONS
An Improved Sequence for Broadband Decoupling: WALTZ-16, Journal of Magnetic Resonance, vol. 52, 1983, pp. 335-338, Shaka et al.
Combined Use of Hard and Soft Pulses for Decoupling in Two Dimensional NMR Spectroscopy, Journal of Magnetic Resonance, vol. 78, 1988, pp. 178-185, Broschweiler et al.

Primary Examiner—Michael J. Tokar
Attorney, Agent, or Firm—Cohn, Powell & Hind

[57] ABSTRACT

The use of 270° Gaussian pulses instead of the selective 90° pulses usual heretofore makes it possible, for many NMR experiments, to achieve a frequency-selective excitation of samples which is largely free from phase errors and which, consequently, does away in many cases with the need for rephasing measures which heretofore were necessary as a rule.

4 Claims, 16 Drawing Sheets

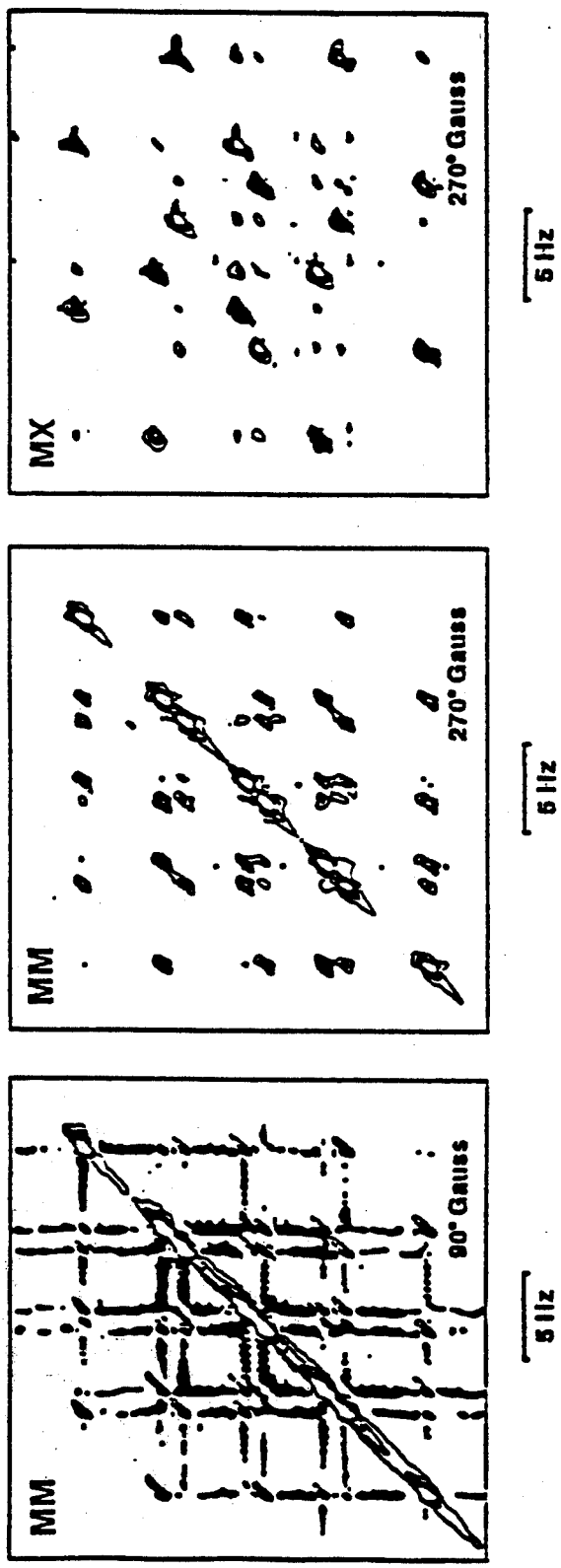

"BUILDING BLOCK"

2D SELEKTIVITY

METHOD FOR SELECTIVE EXCITATION OF NMR SIGNALS

The present invention relates to a method for selective excitation of NMR signals by irradiating upon a sample, which is located within a homogeneous static magnetic field, an rf pulse sequence comprising at least one selective Gaussian pulse.

It is a requirement of many NMR spectroscopic methods that the nuclear spin resonances under observation must be excited in a frequency-selective way. Initially, selective excitation was achieved by simply applying rectangular rf pulses of very long duration and low power, which were described as "soft" pulses. However, the application of such pulses is connected with the disadvantage that their frequency spectrum shows side lobes which are far remote from the resonance frequency thus leading to the excitation of undesirable nuclear spin resonances. It has been found that a much better frequency behavior can be achieved if the pulses have a more favorable shape, instead of being rectangular. Although pulses with very sophisticated phase and amplitude modulation have been developed in the course of the past few years, the Gaussian pulse still has been found to be particularly favorable due to its relatively short duration and simple shape.

However, just as all the other excitation pulses used in high-resolution NMR, the 90° Gaussian pulse also provides the disadvantage that it leads to strong phase response in the resulting transverse magnetization. Although it would of course be possible theoretically, when recording unidimensional spectra, to effect a first-order phase correction, such correction cannot be carried out in practice without having to accept an important shift in the spectrum base line. And in the case of more complex pulse experiments, where coherent transmission takes place, such correction is no longer possible because then not only in-phase, but also anti-phase magnetizations are encountered.

From a paper by Brühschweiler et al. published in J. Magn. Reson. 78, 178 (1988) a method for refocusing the magnetization has been known where a soft 90° pulse is followed by a hard 180° pulse and the latter is then followed by the data-logging step at the end of a certain time delay equal approximately to 60% of the duration of the (truncated) Gaussian pulse. However, such extension of the pulse length is undesirable as it results in an increase of the relaxation-based losses. In addition, the proposed solution is not suited for refocusing coupled spins. Instead, the phase error will even be increased in such cases because the hard 180° pulse inverts the polarizations of the coupled partners, thus preventing the couplings from being refocused. Consequently, this method is absolutely of no use if the area of interest contains a single multiplet only which is the case in the selective version of the NOESY experiment for small flip angles. One might consider to effect refocusing by a soft 180° pulse, instead of a hard 180° pulse, as in this case any dephasing caused by couplings would be reversed, just as any dephasing resulting from offsets. Yet, the application of a soft 180° pulse creates as many problems as are solved by it. Firstly, it leads again to an increase of the duration of the sequence. And secondly, every magnetization, which relaxes during the first pulse in the Z direction or which has not been excited by the first pulse, may be excited by the refocusing pulse so that an EXORCYCLE phase shift of the second pulse would become important, which would extend the overall duration of the experiment. Consequently, this method—which has been described for example by Bodenhausen et al. in J. Magn. Reson. 27, 511 (1977)—is not suitable for application in all cases.

A paper by Friedrich et al. published in J. Magn. Reson. 75, 390 (1987) describes the use of a "half Gaussian pulse" as means for eliminating phase errors occurring in selective excitation. Although the "half Gaussian pulse" as such does not generate any constant-phase magnetization, constant-phase spectra can be obtained by adding the results of two pulse sequences in which a "half Gaussian pulse" is applied in alternation with a hard 180° pulse, for alternating scanning cycles. Such a sequence leads to the effect that the y components of the magnetization will balance out each other, while the x components are preserved.

From the above it results that in spite of all efforts taken to this day, there still remains the problem to find a method for selective excitation of NMR signals where independent refocusing of the transverse magnetization produced by the excitation is achieved in a simple manner without any undesirable side effects which would complicate the use of the method and/or even render its application impossible for certain experiments.

This object is solved according to the invention by the fact that the at least one frequency-selective Gaussian pulse used for carrying out the method is a 270° pulse.

It has been found that by applying a 270° Gaussian pulse, instead of a 90° Gaussian pulse, and by having it followed by a hard or maybe also a soft 180° pulse, one achieves excellent refocusing, which permits to carry out experiments of the most diverse kinds, without any additional measures. The whole frequency-selective excitation pulse being "soft", the coupling partners of a multiplet, in particular, will not be disturbed, and the development of the magnetization resulting from couplings is refocused just in the same manner as if it were caused by chemical offsets.

The 270° Gaussian pulse employed according to the invention may be used in all methods which heretofore made use of a frequency-selective 90° pulse. The application of the 270° Gaussian pulse then always provides the advantage that all additional refocusing measures can be spared, and the disadvantageous effects of such measures will not be encountered. For example, and in particular, at least one of the frequency-selective excitation pulses comprised in a NOESY pulse sequence may be a 270° Gaussian pulse. Of course it is preferred that all frequency-selective excitation pulses be formed by 270° Gaussian pulses.

As in two-dimensional NMR spectroscopy, a 270° Gaussian pulse may be employed also in NMR tomography in the image-generating pulse sequences. If the frequency-selective excitation pulses are introduced under a volume-selection gradient, then the gradient reversals usually carried out heretofore after the excitation pulse can be spared. The same then also applies by analogy to the volume-selection process, which is necessary for NMR spectroscopy in selected volume elements of a body, where at least one of the frequency-selective excitation pulses comprised in the volume-selective pulse sequence may then again be a 270° Gaussian pulse.

The theoretical fundamentals, and examples, of pulse sequences employed by the method according to the invention will be described and explained hereafter in more detail with reference to certain diagrams represented in the drawing. The features appearing from the following specification and the diagrams may be employed in other embodiments of the method of the invention individually or in any desired combination.

FIG. 13 shows a soft NOESY spectrum of a diagonal multiplet of the methyl ester of trans-2-phenyl cyclopropane carboric acid, obtained with the aid of three 90° Gaussian pulses;

FIG. 14 shows the same spectrum as FIG. 13, though obtained through excitation by three 270° Gaussian pulses;

FIG. 15 shows the spectrum of an extra-diagonal multiplet, obtained under the same conditions as the spectrum of FIG. 14;

It will be recognized easily that for every long, selective pulse of low intensity off-resonance effects may not be neglected.

Figure 1:
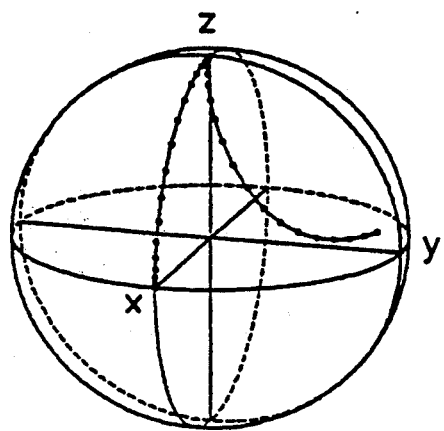
FIG. 1 shows a perspective representation of the spatial development of the magnetization, for a 90° Gaussian pulse.
Figure 2:
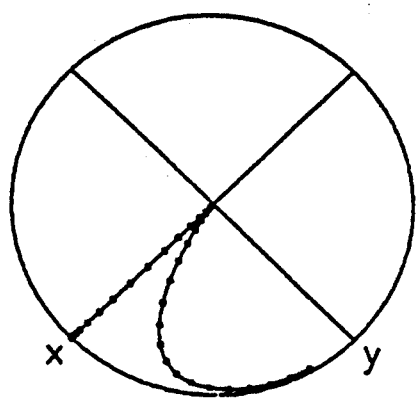
FIG. 2 shows the projection of the development of the magnetization according to FIG. 1 upon the xy plane.

It is of interest in this connection to observe exactly what happens to a single magnetization vector in each phase of a 90° Gaussian pulse. At the beginning of the Gaussian pulse, the magnetic field $B_1$ is very low and a vector, which is only a short way off resonance, turns substantially around the z axis. In this phase, the value of the transverse magnetization is also low, and the rotation about the z axis has only little effect on the final magnetization. The $B_1$ field and the flip angle then grow until the $B_1$ field reaches its maximum at the middle of the pulse. The resonant vector is then shifted relative to the z axis by 45°, and a vector which is off the resonant range then rotates mainly about the $B_1$ field at this point. During the last part of the pulse, when the resonant magnetization vector approaches the x,y plane, the $B_1$ field drops. During this part of the pulse, maximum dephasing of the off-resonant magnetization occurs, because then the rotation resulting from the frequency offset dominates and the transverse component of the magnetization is high. This situation will be easily understood when regarding the magnetization curves. FIG. 1 shows the well-known "grapefruit diagram", which shows the paths of the magnetization vectors which are either at resonance or exhibit a reduced offset of 0.11 relative to the resonance frequency. This situation is defined by $n\Omega/\omega_1{}^{max}$, wherein $n=2\beta/\Pi$ (i.e. $n=1$ for $\beta=90°$ and $n=3$ for $\beta=270°$). "Reduced offset" is defined as comparing the behavior of a magnetization component with the same absolute offset under Gaussian pulses having the same width and distinguishing themselves only by the fact that $\omega_1{}^{max}$ is increased to the triple value for the 270° Gaussian pulse, compared to the 90° Gaussian pulse. The development over time of the paths is indicated by dots assigned to identical time intervals. FIG. 2 shows the same paths, projected upon the x,y plane. It should be noted that the path of the frequency-offset magnetization remains rather close to the x,z plane until near the end of the pulse when rather rapid dephasing occurs. In addition, it can be noted that the value of the magnetization is still very important in the x,y plane, amounting to approx. 95% of the value at resonance, but is dephased by approx. 80°.

Figure 3:
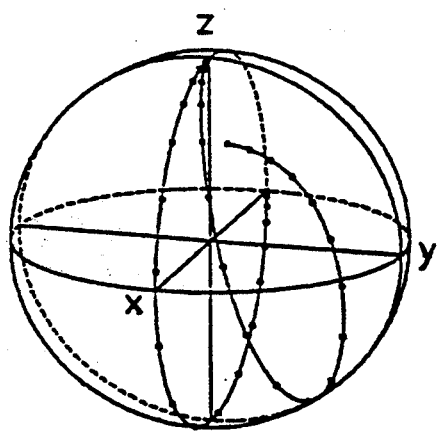
FIG. 3 shows a diagram of the development of the magnetization similar to FIG. 1, but for a 270° Gaussian pulse.
Figure 4:
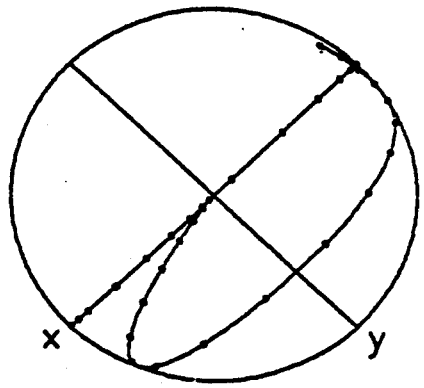
FIG. 4 shows the projection of the development of the magnetization according to FIG. 3 upon the xy plane.

We are now going to regard the same situation for a Gaussian pulse having the same duration, but a flip angle of 270° at resonance. The $B_1$ field is three times as strong in this case as for a 90° pulse. For the first part of the pulse, the observations are substantially the same as for the 90° pulse. The $B_1$ field is low, and the rotation due to the frequency shift is dominant. This is, however, of little effect, the transverse magnetization being low. As $B_1$ reaches its maximum, the situation changes, compared with the first-described case, as now the resonant component extends at an angle of 135° relative to the z axis. At the point where the frequency-shifted magnetization vector passes the x,y plane and the dephasing effects reach their maximum, the effective field is closer to the x,y plane as in the case of the 90° pulse. Consequently, the magnetization is dephased to a smaller degree than in the case of the 90° pulse. The next important point in time arises when the resonant vector passes the south pole. At his point, the off-resonance magnetization which previously had moved away from the resonant vector, starts converging towards the $-x$ axis. The $B_1$ field gets increasingly weaker, as the magnetization moves towards the $-x$ axis, so that the rotation resulting from the frequency shift gets more important. As in the case of the 90° Gaussian pulse, this movement has a strong effect because the value of the transverse magnetization is high at this point. While in the case of the 90° Gaussian pulse the main source for this lay in the phase error, it has to be considered that in the case of the 270° Gaussian pulse the magnetization has passed the greatest part of its time in the first two quadrants, where dephasing occurred, so that the stronger rephasing effect in the third quadrant, during the last part of the 280° Gaussian pulse, is indeed helpful for the purpose of refocusing the magnetization. It is, therefore, to be expected that the same properties, which lead to an increase of the phase error for a 90° Gaussian pulse, effect a reduction of the phase error for a 270° Gaussian pulse. This, too, will be easily recognized when regarding the magnetization paths. Indeed, FIGS. 3 and 4 show the "grapefruit diagram", or the projection upon the x,y plane of the magnetization vectors with the same reduced frequency shift which also underlies FIGS. 1 and 2, but in this case calculated for a 270° Gaussian pulse. It must be noted in this connection that the frequency-shifted magnetization is directed almost parallel to the x,y plane during the medium part of the pulse, and is refocused towards the $-x$ axis at about the end of the pulse. Further, it should be mentioned that the magnetization paths represented in FIGS. 1 to 4 were obtained by numerical solution of the Bloch equations and that the points define identical time intervals. The Gaussian pulses were truncated at 5%.

The equations of motion for the magnetization are simple for pulses of constant amplitude, as the magnetization rotates about a constant effective field which is inclined relative to the x,y plane, and as the effects of all pulses of constant amplitude can be computed easily. The situation gets more complex for amplitude-modulated pulses because then the effective field exhibits a time-dependent flip angle so that it is rather difficult to predict analytically the effects of such pulses. Apart from a few specific cases, one has to rely on approximations. The usually employed approximation, which is based on Fourier transformation, being frequently misleading, preference has to be given to the only safe approximation, namely the one based on a numerical solution of the Bloch equations. A Fourier approximation would indicate that their does not exist any difference in phase behavior between a 90° and a 270° pulse used as excitation pulse. In reality, however, there exists indeed a fundamental difference between the two pulses.

Solutions of Bloch equations can easily be obtained iteratively by subdividing the envelop of the pulse into a plurality of equal intervals and assuming that the amplitude is constant in each interval. All the simulations described herein, including the magnetization paths dealt with above, have been calculated in this manner. The main disadvantage of this method lies in the fact that it does not supply an intuitive method for determining the pulse shape although it always provides a correct answer to this problem.

Figure 5:
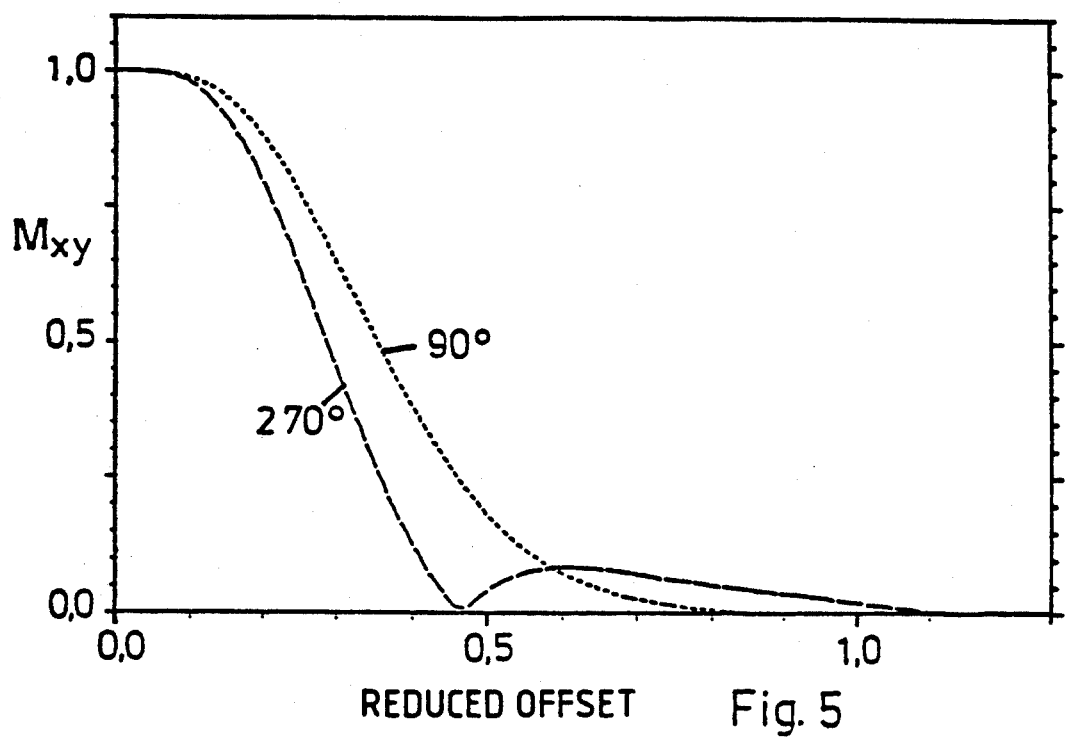
FIG. 5 shows a diagram showing the value of the transverse magnetization as a function of the reduced offset, for a 90° and a 270° Gaussian pulse.
Figure 7:
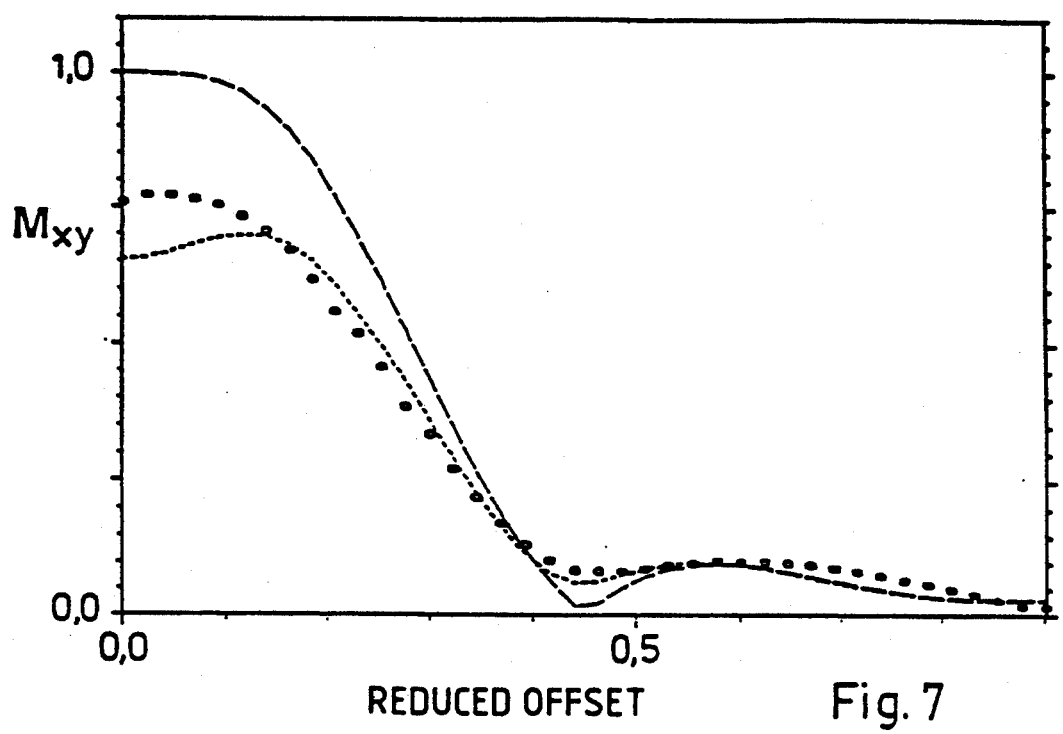
FIG. 7 shows a diagram comparing the simulated and the experimental amplitude behavior of a 270° Gaussian pulse as a function of a reduced offset.

FIG. 5 illustrates the expected signal amplitude when a 90° (short-dashed line) and a 270° (long-dashed line) Gaussian pulse is used for excitation. All computations were carried out for pulses of the same length so that the only difference between the 90° and the 270° pulse lies in the triple value of the amplitude. The simulation predicts, by first approximation, that the 270° Gaussian pulse is a little more selective than the 90° Gaussian pulse of the same length. This marginal increase of selectivity cannot be expected from the observations based on Fourier transformation, but is absolutely welcome. The simulation further shows that the 270° Gaussian pulse may be expected to have a side lobe of low intensity, and this property also could not be expected according to the Fourier transformation. FIG. 7 illustrates the simulated behavior of a 270° Gaussian pulse (the short-dashed line with, the long-dashed line without consideration of the effects of the $B_1$ inhomogeneity), relative to the experimental behavior (circles) and indeed a high degree of conformity can be established.

Figure 6:
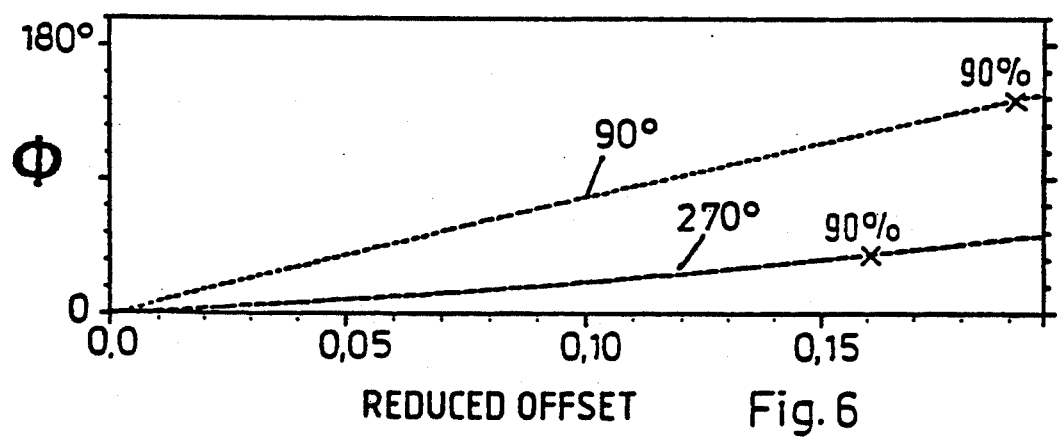
FIG. 6 shows a diagram showing the phase behavior in the range of small offsets, for a 90° and a 270° Gaussian pulse.
Figure 8:
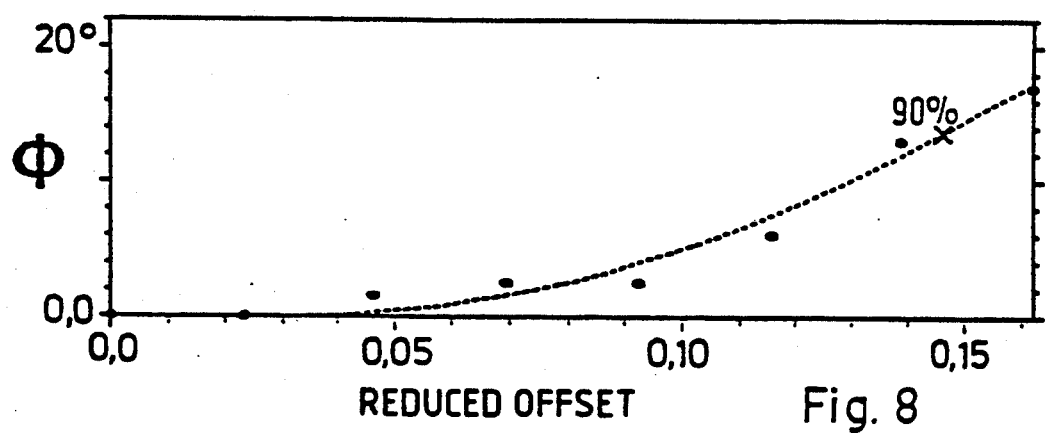
FIG. 8 shows a diagram illustrating the phase behavior corresponding to FIG. 7.
Figure 9:
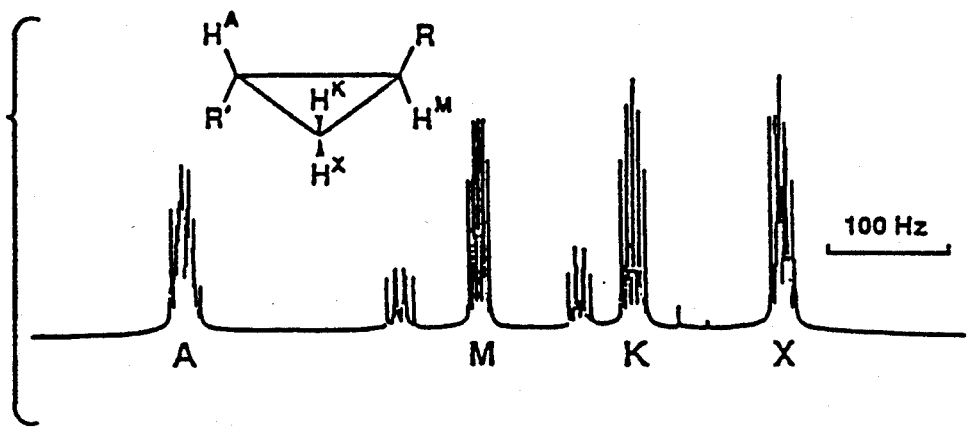
FIG. 9 shows the spectrum of the methyl ester of trans-2-phenyl cyclopropane carboric acid which was obtained with the aid of a hard 90° pulse.
Figures 10, 11, 12:
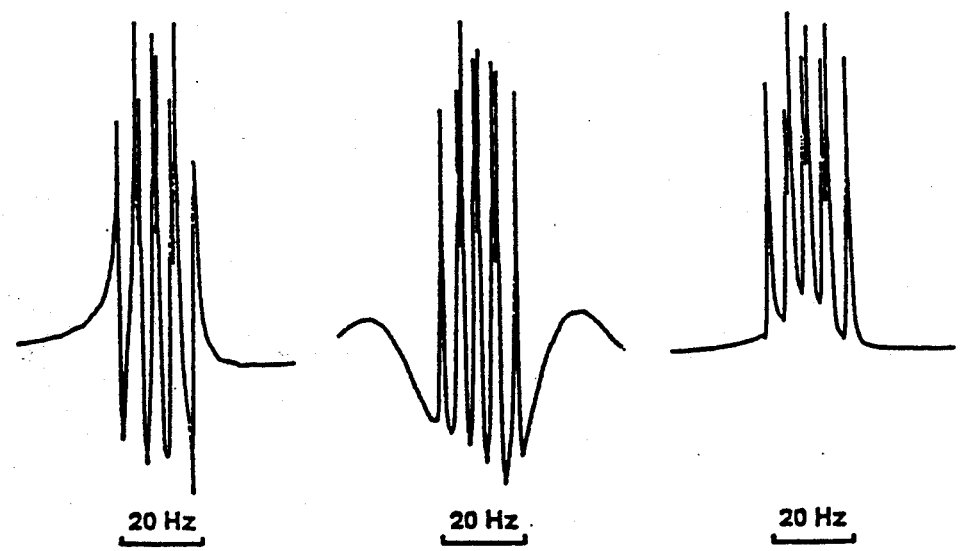
FIG. 10 shows the spectrum of the M multiplet of the same compound, following excitation by a 90° Gaussian pulse, without phase correction.
FIG. 11 shows the same spectrum as FIG. 10, with important frequency-dependent phase correction.
FIG. 12 shows the spectrum of the same M multiplet, but following excitation by a 270° Gaussian pulse, without phase correction.

FIG. 6 illustrates the calculated phase behavior in the central excitation range for 90°(short-dashed line) and 270°(long-dashed line) Gaussian pulses. It is readily understood that, contrary to the 90° Gaussian pulse which has a very steep phase gradient, the 270° Gaussian pulse shows an almost level phase behavior in this range. It is particularly important to note that in the useful range of excitation, i.e. in the range of 100% to 90% of the maximum amplitude of excitation, the phase error of the 270° Gaussian pulse amounts to less than ¼ of the phase error of the 90° Gaussian pulse. As appears in more detail from the experimental results (circles) illustrated in FIG. 8, the phase error is smaller than 15° in this range, which is well in conformity with the calculated values (short-dashed line).

In addition, FIG. 7 shows that there are minor differences between the experimentally determined behavior and the calculated behavior of the 270° Gaussian pulse. The most important difference seems to be that the zero range, as predicted by simulation, appears smoother and that the magnetization at resonance is somewhat lower than the intensity obtained by a hard pulse. These deviations can be explained easily to be due to the inhomogeneity of the $B_1$ field. It is generally known that sample heads for high-resolution spectroscopy are usually designed for a high space factor, in order to obtain the highest possible sensitivity, even if one has to pay for it by a loss in homogeneity of the $B_1$ field. There have been carried out mutation trials using a 5 mm proton sample, and these trials show a distribution of the rf field which can be defined, by Lorentz approximation, by a width at half height of $\Delta B_1 \approx 0,1 < B_1 >$. If this relation is input into the simulation program, then the conformity between experiment and the simulation is much better as illustrated by FIG. 7. Although the $B_1$ inhomogeneity results in a sensitivity loss of approx. 20% for a 270° Gaussian pulse, this seems to be a relatively low price for the clearly improved phase property.

The considerable advantages that can be achieved with the aid of the method according to the invention become clear in practical use of the method. In FIGS. 9 to 12 spectra of the methyl ester of trans-2-phenyl cyclopropane carbon acid are compared, which have been obtained by a hard 90° pulse, a 90° Gaussian pulse without phase correction, the same pulse with important frequency-dependent phase correction, and a 270° Gaussian pulse according to the invention without phase correction. Further examples relate to trials using selective two-dimensional exchange spectra of a scalar-coupled spin system (soft-NOESY). The normal NOESY experiment with small flip angles consists of a sequence of three non-selective pulses:

$$90°-t_1-20°-\tau_m-20°-t_2 \qquad [1].$$

When selective pulses are used, the following sequence can be substituted for this sequence:

$$90°_{Gauss}(\Omega_A)-t_1-90°_{Gauss}(\Omega_A)-\tau_m-90°_{Gauss}(\Omega_Z)-t_2 \qquad [2].$$

The frequencies stated in brackets are the frequencies of the rf carrier of the selective pulses, which frequencies should be centered relative to the chemical offsets corresponding to the center of the interesting multiplets. The definition for a diagonal multiplet AA is $\Omega_z=\Omega_A$, a cross-peak multiplet AX by $\Omega_z=\Omega_x$, etc. When a 270° Gaussian pulse is used, the sequence simply becomes $$270°_{Gauss}(\Omega_A)-t_1-270°_{Gauss}(\Omega_A)-\tau_m-270°_{Gauss}(\Omega_Z)-t_2 \qquad [3].$$

While in this sequence the first and the last pulses simply serve for converting the longitudinal polarization into transverse magnetization, the second pulse serves the purpose to effect the reverse process. It goes without saying that when a pulse which is free from phase distortions, such as a 270° Gaussian pulse, is suited for converting an $M_z$ polarization, for example a pure $M_x$ polarization, without notable phase dispersion, the same pulse will also be in a position to convert back the $M_x$ component of the magnetization, i.e. the projection of the transverse magnetization upon the x axis, into a longitudinal $M_z$ polarization.

When the soft-NOESY experiment is carried out using 90° Gaussian pulses, it is necessary to perform a two-dimensional correction of the fifth order. This is by no means a trivial operation. FIGS. 13 and 14 show the spectra of the MM diagonal multiplet of a sample of the methyl ester of trans-2 phenylpropane carbon acid which was obtained with the aid of the soft-NOESY sequences according to equations [2] and [3], using 90° or 270° Gaussian pulses and a type AM 400 Bruker spectrometer equipped with a device for selective excitation, make Oxford Research Systems. It was tried to phase the first spectrum, using corrections of the first order, which inevitably led to heavy rolling of the datum plane of the spectrum, whereby the components of low intensity of the multiplet, which are found outside the diagonal line, were covered up. In contrast, no phase-dependent corrections were performed in the case of the second spectrum illustrated in FIG. 14. The difference between the two spectra is self-explanatory. FIG. 15 shows a spectrum of the MX cross-line of the same compound, obtained with the aid of 270° Gaussian pulses. The results are excellent in this case, too, without any frequency-dependent phase correction.

The illustrated selective NOESY experiment is intended mainly for quantitative examinations. In this case it is important that no distortions be introduced into the spectrum, and it has been found that the use of 270° Gaussian pulses is the best means to achieve this objective with the selective versions of the NOESY experiment.

Just as in the soft-NOESY experiment described before, the use of the 270° Gaussian pulses is of advantage in all cases where selective 90° Gaussian pulses have been used heretofore, as for example in selective TOKSI, TOE and, in particular two-dimensional experiments. The same advantages are obtained when selective excitation pulses are employed in connection with a field gradient, for disc-selection purposes. The use of a 270° Gaussian pulse for selective excitation of an area selected by means of a field gradient may eliminate the need for generation of a field echo, which is necessary when a usual 90° Gaussian pulse is used. Consequently, the use of 270° Gaussian pulses, instead of 90° Gaussian pulses, suggests itself for the pulse sequences usual in NMR tomography for image generation. The same applies correspondingly for cases where a volume element of a larger body is to be excited selectively, by multiple disc selection in different directions, for examination of the NMR spectrum of such a volume element.

Figure 16:
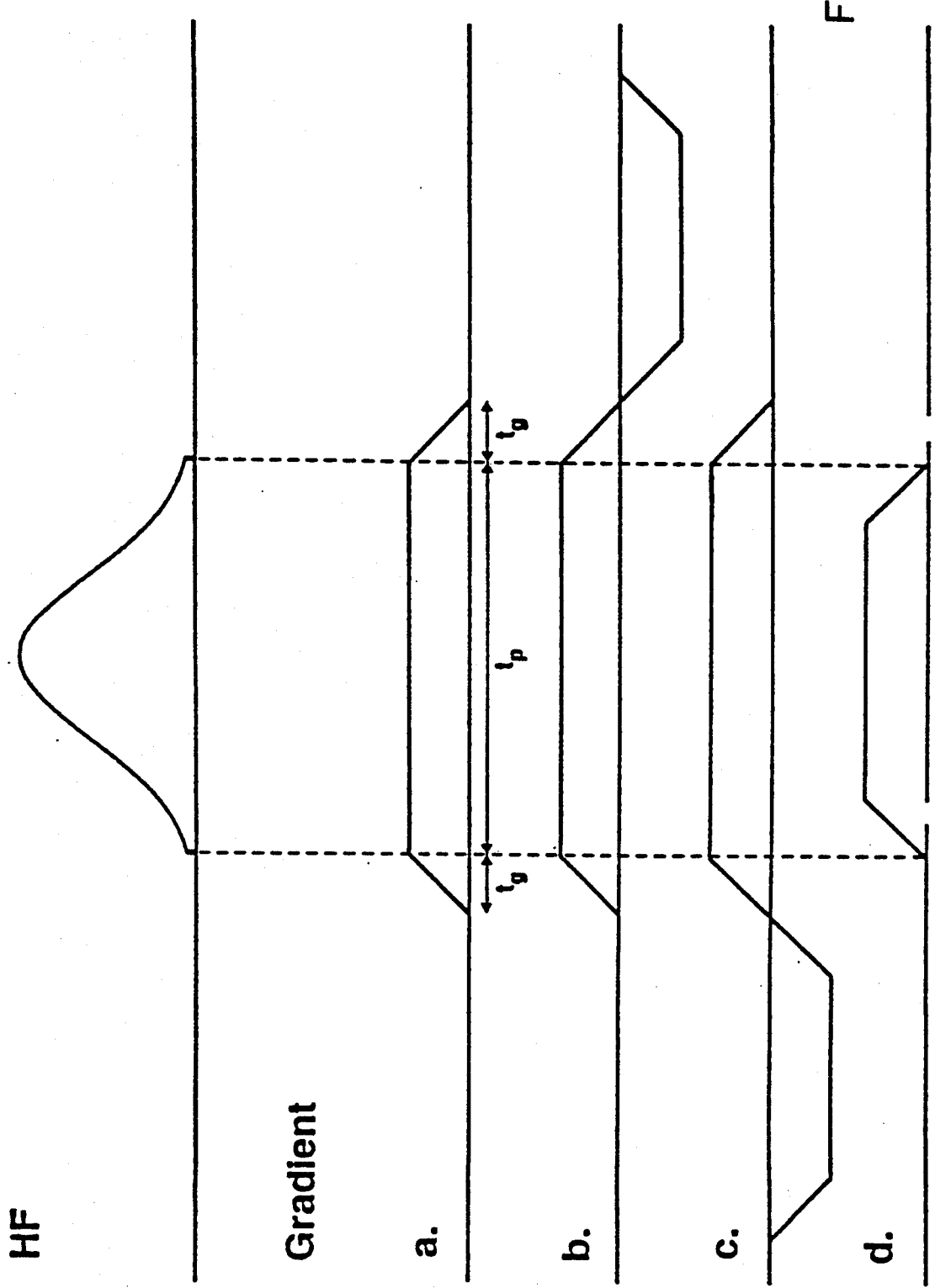
FIG. 16 shows a diagram illustrating the development over time of certain gradients for selective manipulation of the magnetization.

It has long been known that the selective excitation of a narrow frequency band in an inhomogeneously enlarged spectrum is a non-trivial matter. In fact, the finite length of a selective rf pulse leads to dispersion of the phases of the transverse magnetization vectors which builds up during the pulse. In the presence of a continuous distribution of offsets, there will be a distribution of effective fields which lead to the formation of a continuous range of flip angles relative to the z axis of the rotating coordinate system. Consequently, the magnetization will have become almost fully dephased at the end of an rf pulse with a small on-resonance flip angle applied according to the diagram illustrated in FIG. 16a, and as a result thereof the signal will almost disappear after the gradient has been switched off. The rf pulse illustrated in FIG. 16 is a truncated Gaussian pulse, but it would be similarly possible to arrange the gradient scenarios also with other pulse shapes. FIG. 16a shows a selective pulse for the conversion of $M_z$ to $M_{xy}$, or inversely, in the presence of a field gradient, without compensation of the phase errors; FIG. 16b shows a selective excitation (for the conversion of $M_z$ to $M_{xy}$) where the transversal magnetization is refocussed by gradient reversal in order to compensate phase dispersion building up during the pulse; FIG. 16c shows a selective pulse for the conversion of $M_{xy}$ to $M_z$, where the phase error is compensated by pre-defocusing of the transverse magnetization by gradient reversal effected before the start of the pulse; FIG. 16d shows the similar arrangement as FIG. 16a, except that the field gradient is switched on and off during the gradient hold-up times $t_g$ within the duration $t_p$ of the truncated Gaussian pulses.

Fortunately, most of the selective pulses, as well as those exhibiting a Gaussian, Sinc or Hermite shape, lead to transverse magnetization with an almost linear phase gradient as a function of the offset during the action on the z magnetization. There is, therefore, the possibility to remove this phase dispersion by refocusing, either with the aid of a non-selective 180° pulse or by reversal of the magnetic field gradient, as illustrated in FIG. 16b. Normally, the gradient reversal option is to be preferred as it avoids the complications accompanying the high rf power necessary for 180° pulses, which must of course be high enough to cover up off-resonance effects. If all non-selective pulses are avoided, as in simulated echo techniques, multi-volume spectroscopy is rendered possible by relocation of the volume of interest (VOI) to another sample area, provided and so long as all the three coordinates of the second VOI differ from those of the first one.

Much effort has been spent on the development of pulse shapes for the selective conversion of $M_z$ to $M_{xy}$, with the objective to achieve a "top hat" frequency response. Of course, most of these research projects gave little consideration to the phase response, assuming that it would be possible to refocus the magnetization after the pulse. However, if the pulse is to serve the purpose to rotate back selectively the transverse $M_{xy}$ magnetization to the z axis, as in the case of SPARS (Spatially Resolved Spectroscopy) or VEST (Selected Volume Excitation Using Stimulated Echoes), the problem of phase dispersion gets more significant. Of course, it is no longer possible to refocus the magnetization once it is directed along the z axis of the rotating coordinate system, so that the phase distribution of the magnetization vectors in the transverse plane must be prepared in a suitable manner before application of the pulse.

Our above discussion of the effects of 270° Gaussian pulses gives consideration also to such pulses which have effects on an equilibrium Z magnetization. When the effects of a pulse on the Z magnetization is known, it is fortunately possible to show analytically how it acts on the transverse magnetization. It can be proved that when a real (i.e. phase-constant) pulse with a time-symmetrical envelope is applied along the Y axis, in competition with the time-symmetrical amplitude-modulated field gradient (generating a magnetic field along the Z axis), the magnetization is subjected to a total rotation $R_{tot}$ about an axis which necessarily must lie in the xy plane. Consequently, the problem is exactly equivalent, for a given magnetization vector, with the rotation generated by a constant-amplitude pulse in the presence of a constant field. In fact, there does not exist any simple possibility to determine the amplitude of the effective field $B_{eff}$ of the effective flip angle $\beta_{eff}=-\gamma_{eff}t_p$ or of the effective rotary angle $\Theta_{eff}$ by analytical means, but this is not really necessary for the purposes of the present discussion. It should be sufficient to note that $\beta_{eff}$ and $\Theta_{eff}$ are constant for a given offset of the resonance and a given pulse shape. It can be shown easily that when a pulse with given values for $\beta_{eff}$ and $\Theta_{eff}$ acts in the YZ plane upon the original magnetization $M^o$, which is directed along the Z axis, then the resulting magnetization is $$M_x{}' = M^o \sin \beta_{eff} \sin \Theta_{eff}$$

$$M_y{}' = M^o(1-\cos \beta_{eff}) \sin \Theta_{eff} \cos \Theta_{eff}$$

$$M_z{}' = M^o(\cos^2 \Theta_{eff} + \cos \beta_{eff} \sin^2 \Theta_{eff}). \quad [4].$$

If, on the other hand, the same pulse acts on a magnetization $M^o$, which is directed along the X axis, then the resulting components are defined as follows:

$$M_x{}' = -M^o \cos \beta_{eff}$$

$$M_y{}' = -M^o \sin \beta_{eff} \cos \Theta_{eff}$$

$$M_z{}' = M^o \sin \beta_{eff} \sin \Theta_{eff}. \quad [5].$$

It is clear from equations [4] and [5] that the $M_z$ response of a pulse acting on the $-x$ magnetization is exactly identical to the $M_x$ response of a pulse acting on the Z magnetization. Consequently, the disc profile selected by a 270° Gaussian pulse (or—for this purpose—any pulse meeting the above conditions) will always be the same, whether the magnetization on which it acts was originally directed along the $M_x$ or along the $M_z$ axis. The resulting magnetization is simply accumulated along a different axis.

Figures 17, 17A, 17B:
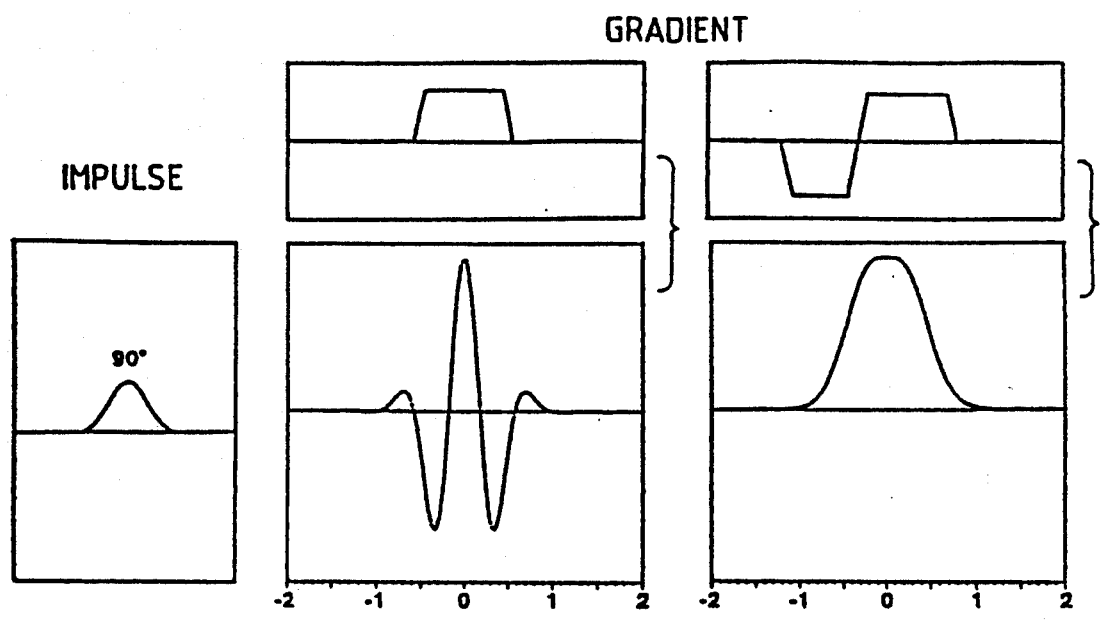
FIGS. 17, 17A, 17B, 17C, 17D, 17E, 17F and 17G show Mz magnetization profiles produced by the effect of y pulses on the transverse magnetization which at the beginning of the pulse is directed exactly along the x axes.
Figures 17C, 17D, 17F:
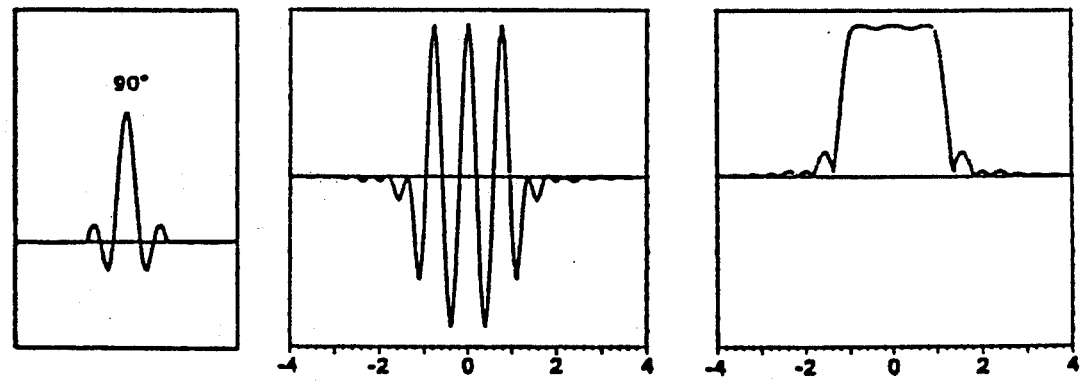

FIGS. 16a and 17c show the $M_z$ profiles for 90° Gaussian and 90° Sinc-shaped pulses acting on the $-X$ magnetization, it being assumed that the latter had been excited uniformly over the whole object before application of the selective pulses. For the sake of simplicity, it will be assumed for the present purposes that the gradients can be switched instantaneously. The horizontal axes are linearly proportional to the distance r from the center of the disc in a direction parallel to the field gradient applied. According to the above considerations, these simulations also describe the X magnetization profiles which are obtained when the same pulses act on an equilibrium Z magnetization. The undesirable profiles of the selective 90° pulses are the direct result of the dephasing occurring during the pulse. If the required transformation is from $M_z$ to $M_x$, the profile can be improved considerably by a refocusing step according to the diagram of FIG. 16b.

If the required transformation is from $M_x$ to $M_z$, no refocusing will be possible. In this case, pre-defocusing may be a practicable alternative. The latter is effected by applying a field gradient for the purpose of producing a phase dispersion of the transverse magnetization before application of the rf pulse, according to the diagram of FIG. 16c. From the above symmetry arguments it results that the phase dispersion produced in this manner should be inversely equal to the phase dispersion produced by a given pulse passing from $M_z$ to $M_{xy}$ so that the pulse will now effect the transformation from $M_{xy}$ to $M_z$. FIGS. 17b and 17d show the profiles which can be obtained in this manner with the aid of 90° Gaussian and 90° Sinc-shaped pulses. This is at present the method of choice for generating satisfactory Z magnetization profiles in spatial localization experiments. However, this procedure is obviously not fully desired as it is a necessary requirement of this procedure that the magnetization has to remain in the transverse plane for an important period of time, which reduces the sensitivity of the experiment when the $T_2$ relaxation times are short, which is frequently the case in in-vivo-$^{31}$P spectroscopy or in spectroscopy on solid bodies such as rubber or plastic materials. To say it more exactly, the whole duration of the pulse and gradient sequence is extended by approx. 55% when pre-defocusing is combined either with a 90° Gaussian pulse or with a 90° Sinc pulse.

Figure 18A:
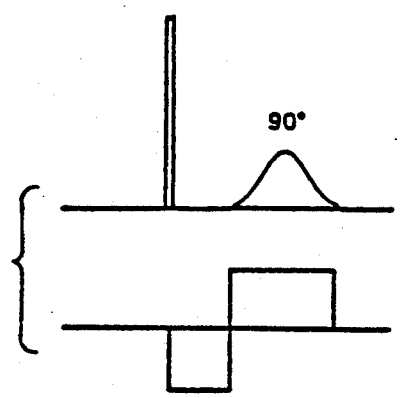
FIGS. 18A, 18B, 18C, 18D, 18E, 18F show the two-dimensional spatial selectivity of 90° and 270° Gaussian pulses.
Figure 18D:
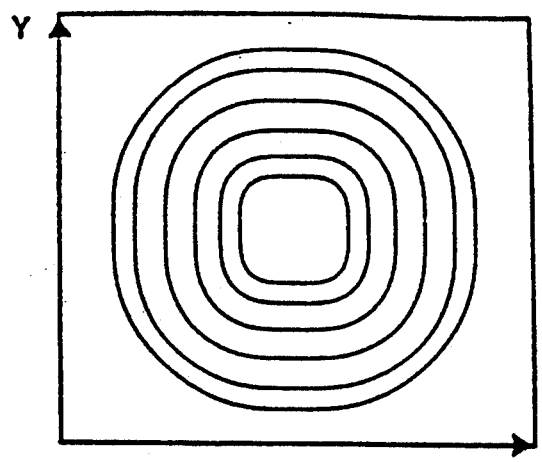
Figure 18B:
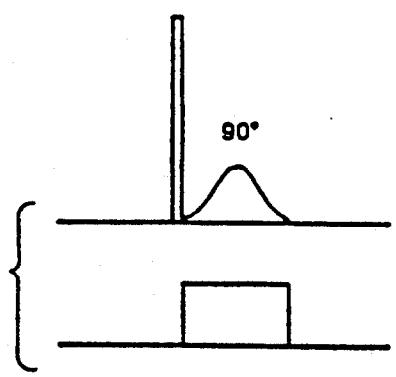
Figure 18E:
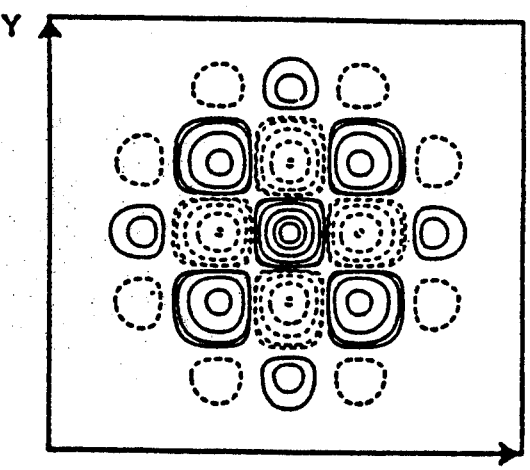

It is useful in connection with the volume localization problem to remember the manner in which the unidimensional profiles of FIG. 17 (belonging to selected planes) combine to form the finally selected volume. FIG. 18 shows the $M_z$ profiles which are obtained along the spatial axes X and Y when two of the "building blocks", as shown in the left half, are arranged in succession with the gradients directed along the X and Y directions (or in the reverse directions). FIG. 18a shows the profile which will be obtained for a 90° Gaussian pulse, with pre-defocusing for transverse magnetization, as in a SPARS experiment. FIG. 18b shows how the attempt to avoid the pre-defocusing step causes the resulting $M_z$ response to be distorted beyond recognition. However, by increasing simply the rf amplitude for generating a 270° Gaussian pulse, it is possible to transform the chaotic response of FIG. 18b to the excellent distribution of FIG. 18b, due to the self-refocusing effect of the 270° Gaussian pulse. The contour lines were plotted at ±5, 10, 25, 50, 75 and 90% of $M^o$. On the whole, it appears from FIG. 18 that all interfering deviations have been summed up, which shows very clearly that the refocusing step is absolutely necessary in order to obtain a useful VOI when 90° pulses are employed.

Figures 17E, 17G:
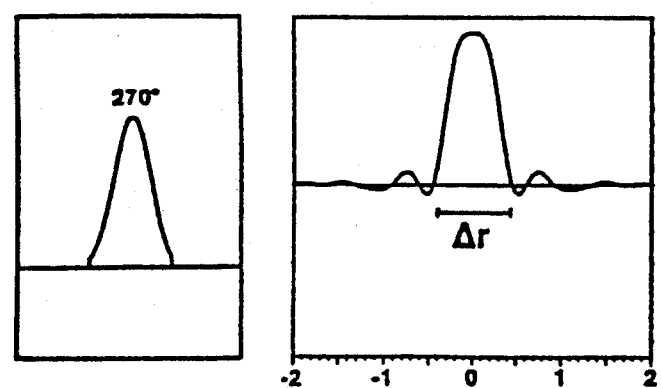

FIG. 17e shows the profile of a 270° Gaussian pulse acting on an X magnetization according to the diagram of FIG. 16a, without a refocusing or pre-defocusing step. All profiles in FIG. 17 have been computed by determining the numerical results of the Bloch equations for pulses of identical duration, assuming that the gradient is switched instantaneously. The horizontal axis is graduated in arbitrary units which for a linear field gradient are directly proportional to the distance r from center of the disc. This makes it possible to compare the behavior of the magnetization under the effect of two Gaussian pulses which distinguish themselves only by the fact that $\omega_1^{max}$ is three times as big for the 270° Gaussian pulse than for the 90° pulse. Particular attention is drawn to the higher selectivity of the 270° Gaussian pulse, as compared to the refocused 90° Gaussian pulse, and to the much higher selectivity of these two pulses, compared with the 90° Sinc pulse. In addition, it should be noted that the rf peak amplitude of the 270° Gaussian pulse is only 15% higher than the peak of the 90° Sinc pulse.

From FIG. 17e it can be noted that the amount of Z magnetization produced by a self-refocusing 270° Gaussian pulse, which cannot be observed due to signal cancellation, amounts to approx. 9% only. The value of the signal that can be observed, and the resulting magnetization profile of a 270° Gaussian pulse, react very sensitively to the truncation level of the Gaussian function. The time-related envelope is defined by $$B_1(t) = B_1^{(max)} \exp\left[-\alpha(t - \tfrac{1}{2}t_p)^2\right] \pi(0, t_p), \quad [6]$$

wherein $\pi$ is a box function with a value 1 between t=0 and $t_p$ and a value 0 everywhere else, and $\alpha = (\ln 2)/(t_\frac{1}{2})^2$, wherein $t_\frac{1}{2}$ is the bandwidth at 50% down of the Gaussian function. The optimum truncation point is found at approx. 0.025 $B_1^{(max)}$, and consequently all 270° Gaussian pulses considered for the present purposes where chopped at 2.5%.

Figure 19A:
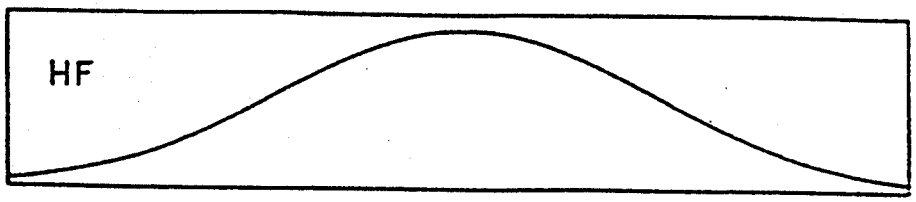
FIGS. 19A, 19B, 19C show the phase development of a family of magnetization vectors under the effect of 90° and 270° Gaussian pulses.
Figure 19B:
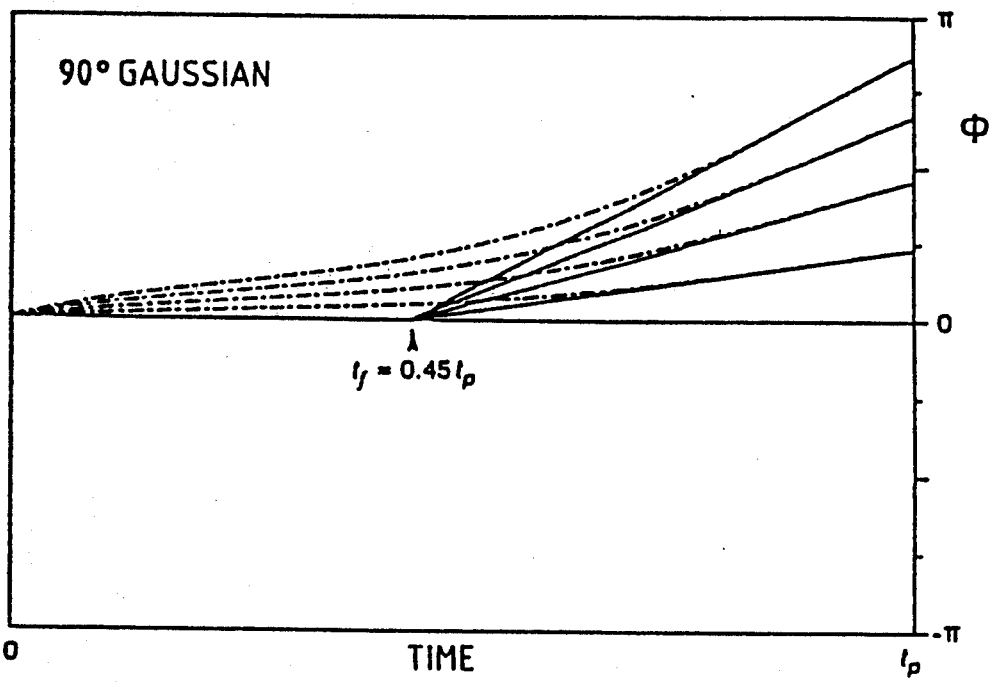
Figure 19C:
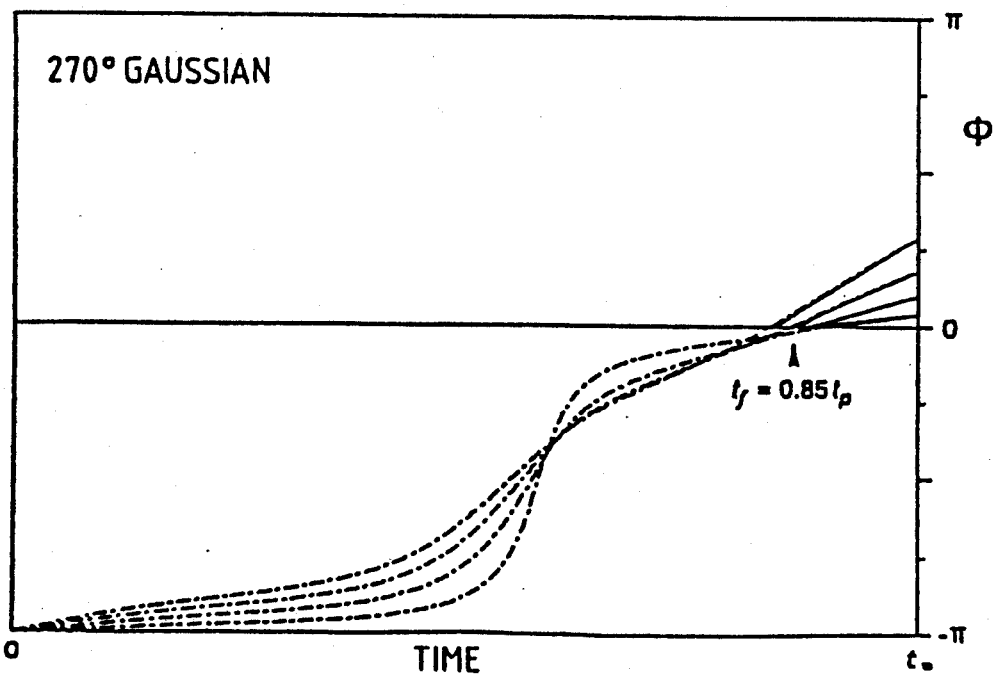

The desired profile of the 270° Gaussian pulse is the direct result of its self-refocusing properties, combined with the suitable selection of the truncation level. In order to understand the principle behind the 270° Gaussian pulses, it may be useful to remember how the individual magnetization vectors develop during the pulse. For the sake of clarity, we will consider hereafter the effect of pulses acting on the equilibrium Z magnetization. The self-refocusing effect of 270° Gaussian pulses has been discussed above, with the aid of the conventional "grapefruit diagrams", where the trajectories are shown on the unit sphere. Now, we are going to regard the development of the phase $\phi = \arctan(M_y/M_x)$ of a family of magnetization vectors at different offsets as a function of time, as shown in FIG. 19a for a 90° Gaussian pulse. It should be noted that the trajectories have a virtual focus at or near $t_f = 0.45\ t_p$, wherein $t_p$ is the total duration of the pulse. In the case of a Gaussian pulse of the same total duration, but with a flip angle of 270° (i.e. with a $\omega_1^{max}$ of triple value) the focus of the same magnetization vectors is found at or near 0.85 $t_p$, as shown in FIG. 19b. It is this offset of the magnetization focus which is responsible for the considerably reduced phase dispersion obtained at the end of a self-refocusing 270° Gaussian pulse. An ideal pulse, in this respect, would be one having its real focus at $t_f \geq t_p$. It is not advisable to chop the pulse (or rather the gradient) at the focussing moment because this would heavily disturb the resulting magnetization profile. The horizontal time axis in FIG. 19 extends between the points where the Gaussian functions are truncated. The vectors lie at reduced frequency intervals of 0.058, and both pulses are chopped at 2.5%. The phases (deflection from the +x axis towards the +y axis) begin at $\phi = 0$ for the 90° pulses and at $\phi = -\pi$, i.e. on the $-x$ axis, for the 270° pulses.

Self-refocusing leads to the $M_z$ profile of FIG. 17e for the 270° Gaussian pulse which (without gradient reversal!) fullfills the criteria for good selectivity having an almost flat region near resonance with steeply dropping flanks and only minor waviness far remote from resonance. The disk thickness, as shown in FIG. 17e and expressed as reduced frequency, is $\delta r = 0.65$. If one regards the contour lines of the two-dimensional selectivity of the 270° Gaussian pulse in FIG. 18c, one readily notices that the VOI is very well defined and almost square in shape.

One of the main disadvantages of the VSE (Volume Selective Excitation) technique lies in the fact that its $M_z$ profile does not exhibit the desirable box-like shape so that one always has to expect break-through signals from regions outside the VOI. Our simulations show that when the spin density of the object under examination (or the density of a particular spin type in such object) is represented by a continuum, then the contribution to the signal from outside the VOI (as defined by the disk thickness $\delta r$; see FIG. 17e) following a self-refocusing 270° Gaussian pulse is approximately equal to 0.02% of the total signal received from the three-dimensional object. It is interesting to note that more than 90° of this negligibly small break-through signal come from a distance of less than $\delta r$ around the VOI. It is, therefore, hardly worthwhile, in any case not in connection with volume-selective spectroscopy, to look for pulse shapes which may be superior to the Gaussian pulses.

It may appear at first glance that the fact that the gradients cannot be switched on and off instantaneously may present an important obstacle to the introduction of self-refocusing 270° Gaussian pulses. If one regards the sequence conventionally used for conversions from $M_x$ to $M_z$ (FIG. 16c), one notes that one degree of freedom consists in "clipping" the length of the pre-defocusing time delay in order to compensate for the finite gradient switching times. In contrast, a self-refocusing 270° pulse, in combination with the gradient scenario of FIG. 16a, does not have this degree of freedom. If one assumes that the magnetization is directed exactly along the X axis before the gradient and the rf pulse are activated, then considerable phase errors will indeed build up during the time interval $t_g$ when the gradient is switched on gradually, thus causing distortions in the resulting profile. Regarded under these aspects, the simulations of the profiles computed for FIGS. 17e and 18c would be nothing more than "soap-bubbles" as they are based on the assumption that the gradients will be switched instantaneously, thus leaving out of regard the effects of the described delay.

Figure 20:
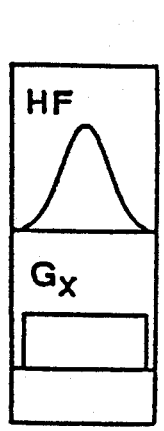
FIGS. 20, 20A, 20B, 20C, 20D, 20E and 20F show the dependance on time of the flip angle $\theta$ of the effective field for a non-resonant vector during a 270° Gaussian pulse, truncated at 2.5%.
Figure 20A:
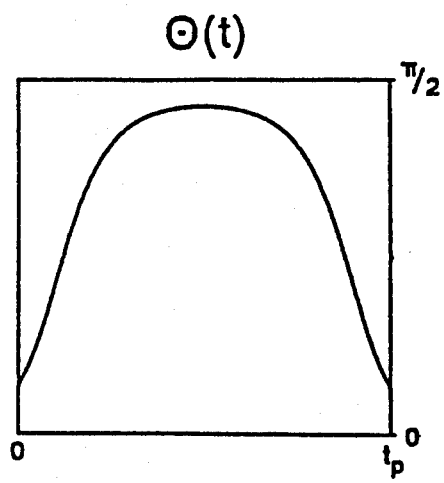
Figure 20B:
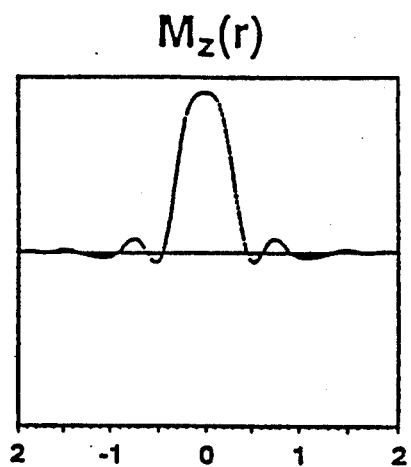
Figure 20G:
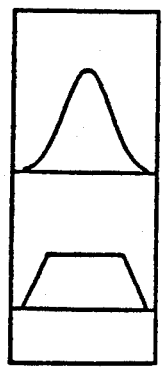
Figure 20C:
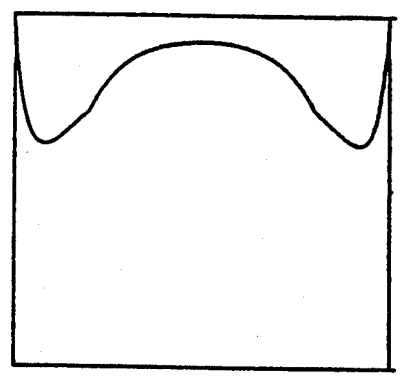
Figure 20D:
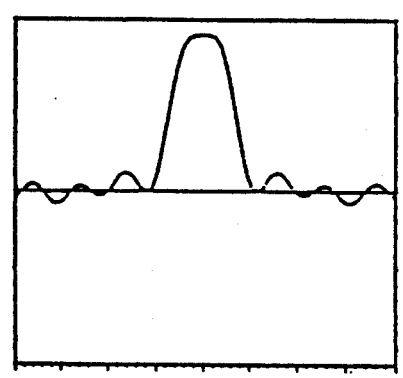
Figure 20H:
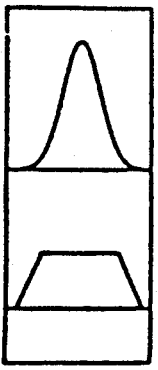

However, the situation can be improved by integrating the switching times into the period $t_p$ of an rf pulse of the type represented by FIG. 16d. It can be assumed realistically that the time delay $t_g$ will be equal to up to 20% of the rf pulse length $t_p$ (both at the beginning and at the end of the pulse). FIG. 20b shows the same $M_z$ profile as FIG. 17e, obtained with the aid of the same 270° Gaussian pulse, and again on the assumption that the gradients are switched instantaneously. FIG. 20d illustrates the manner in which the profile is distorted when the same rf pulse is used, but with a field gradient rising linearly from t=0 to t=0.2 $t_p$ and dropping similarly linearly from t=0.8 $t_p$ to t=1.0 $t_p$.

It is clear that these distortions are rather serious and that a way should be found to compensate for these effects. To this end, we are going to regard the consequences which switching of the gradients during the pulse has on the time-dependence of the instantaneous flip angle Θ. It is one of the intrinsic properties of any Gaussian pulse, in the presence of a constant field (i.e. in the absence of switched gradients) that the effective field is directed close to the Z axis during an early portion of the pulse, moves gradually towards the transverse plane as $B_1$ rises, and returns finally towards the Z axis during the last pulse section. This leads to so-called "tear-drop" trajectories for magnetization vectors with important offset. The behavior of the flip angle Θ(t) (deflection relative to the Z axis) is represented in FIG. 20a for a 270° Gaussian pulse in the presence of a constant field. The result is the undistorted profile of FIG. 20b. Regarding now the behavior of Θ(t) for a pulse with slowly rising gradient, one notices that—strictly contrary to the situation just described—a $B_1$ which does not disappear exists at the very beginning of the rf pulse, instead of a Z component of the effective field. Consequently, Θ(t=0)=π/2. FIG. 20c illustrates the way in which the behavior of Θ(t) is distorted during the gradient-switching period. It is clear that this results in a considerable distortion of the trajectories so that the unacceptable profile of FIG. 20d does not surprise.

In order to eliminate the effect which the gradient-switching process has on the excitation profile, it is necessary to adapt the behavior of Θ(t) with $t_g$=0 during any sequence as far as possible to the behavior of the ideal case of FIG. 20a. The method which would most obviously suggest itself consists in weighing simply the pulse shape by the profile of the gradient since Θ remains constant when a reduction of the gradient amplitude is accompanied by a corresponding reduction of the rf amplitude. However, this would leave a certain degree of distortion of the trajectories, due to the following reduction in value of the effective field during the gradient build-up period. An approach which would seem more satisfactory consists in modifying the Gauss-shaped envelope by the gradient envelope and admitting a certain period of time for a greater rotation at the beginning and at the end of the pulse when the rf amplitude is low. This can be achieved very simply by reducing the truncation value of the Gaussian function.

Figure 20E:
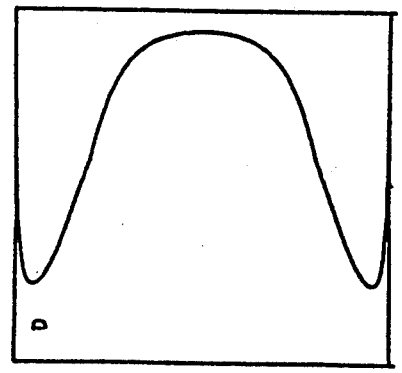
Figure 20F:
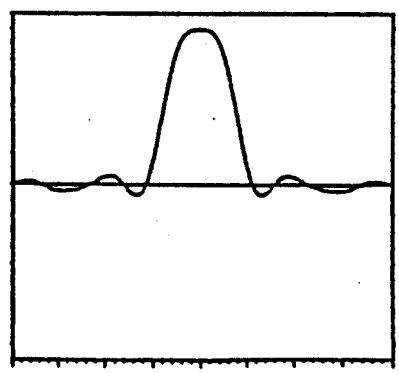

FIG. 20e shows Θ(t) for a 270° Gaussian pulse, broken off at 0.28% (as compared to 2.5% in FIG. 20c). One recognizes that the behavior is very similar in this case to the ideal behavior of FIG. 20a, except that Θ rises towards π/2 at the very beginning and the very end of the pulse. This minor deviation is of no significance as the effective field is as low at these points as to have only little influence, and in effect it appears that the profile of FIG. 20f is exactly the same as that of FIG. 20b, except for a trivial scaling of the disk thickness caused by a slightly higher power which is required for a pulse of lower truncation level. The scaling factor is approx. 1.2 when $t_g/t_p$=0.2. So, it is possible for a self-refocusing 270° Gaussian pulse to compensate almost fully the gradient switching effects, by simple reduction of the truncation level.

Figure 21:
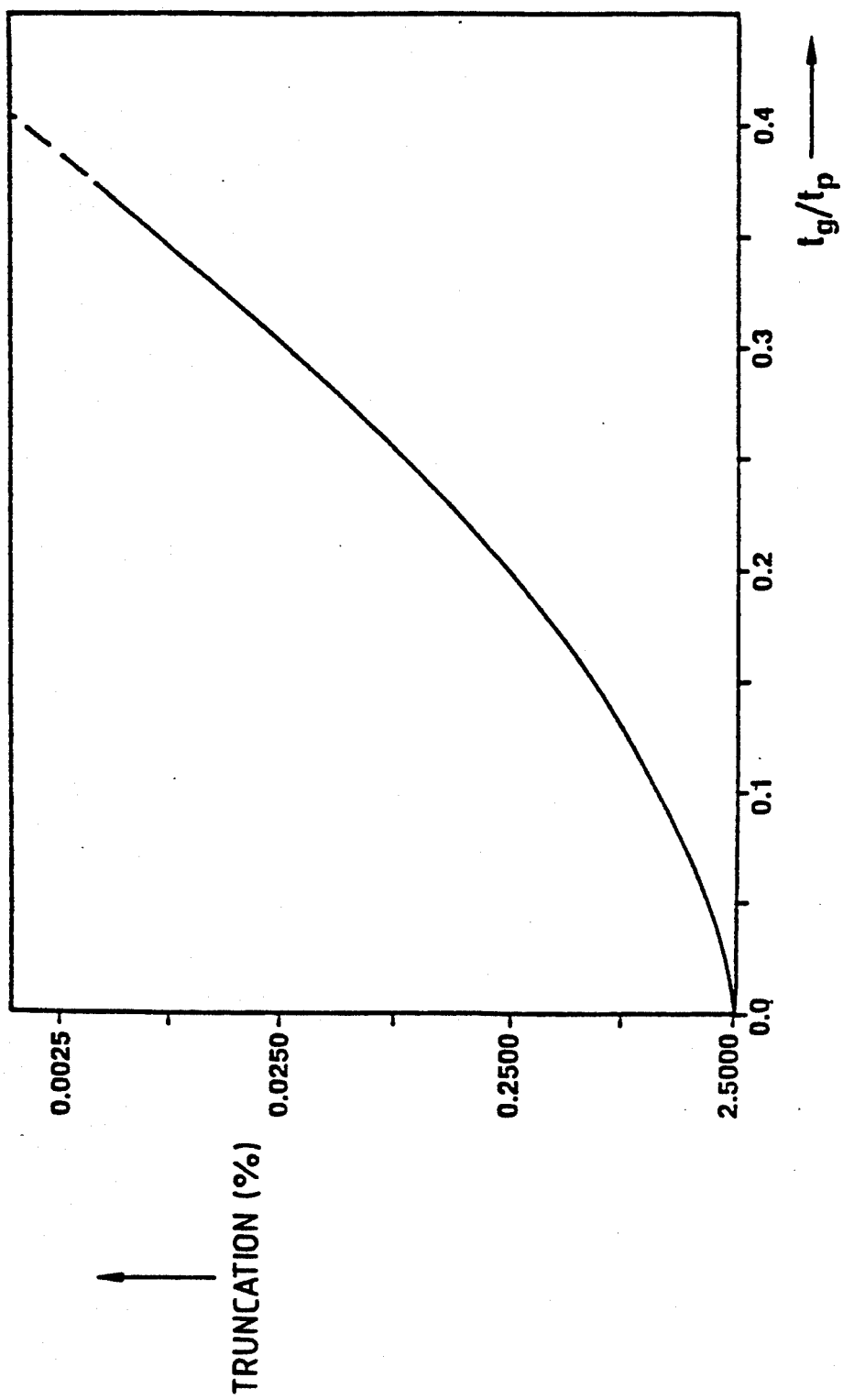
FIG. 21 shows the truncation level required for a satisfactory profile for a 270° Gaussian pulse, as a function of the gradient build-up time $t_g/t_p$.

All of the simulations illustrated in FIGS. 20c to 20f were performed for a situation where the gradient switching time $t_g$=0.2 $t_p$. FIG. 21 shows the truncation level necessary if the same profile is to be obtained as in FIG. 20b, for a switching time range of $t_g/t_p$. Unfortunately, it is not possible for values of $t_g/t_p$>0.35 to obtain a satisfactory profile merely by reducing the truncation level.

The above discussion shows clearly that 270° Gaussian pulses have a VOI, without refocusing step, which is at least as well defined as that of a 90° Gaussian pulse, with a refocusing step. In addition, sequences using a 270° Gaussian pulse are significantly less sensitive to flux effects or $t_2$ relaxation effects. For SPARS or SPACE (Spatial and Chemical Shift encoded Excitation) experiments, we recommend the use of self-refocusing 270° Gaussian pulses, instead of the selective 90° pulses.

FIGS. 22a to 22c show pulse and field gradient diagrams for (a) VSE, (b) SPACE and (c) SPARS experiments. The subscripts X, Y and Z written in capital letters relate to orthogonal spatial directions within the probe, while the subscripts x and y written in small letters designate the phases of the rf pulses in the rotating coordinate system. When selective 90° Gaussian pulses of a duration $t_p$ and with a 2.5% truncation are used (or if instead 90° Sinc pulses of a duration $t_p$ with three zero-axis crossings are to be used), then the relation in FIG. 22b and FIG. 22c is $t_r \approx 0.55$ $t_p$. For the purposes of these diagrams it has been assumed that the gradient pulses are switched on before the beginning of the rf pulses and switched off after the end of the rf pulses. The last pulse of the sequences may simply be a 90° read pulse which may be introduced by any combination of pulses for the suppression of solvents, spectra editing, etc.

When regarding the SPARS experiment of FIG. 22c, one clearly recognizes the necessity for the pre-defocusing gradient and the non-selective 180° pulse. The use of the 270° Gaussian pulse according to the invention simplifies the sequence and reduces it to the self-refocusing SPARS sequence (SR-SPARS) according to FIG. 23a. Similarly, one can do without the re-focusing gradient and the non-selective 180° pulse (which is one of the features of the experiment requiring much input) for the SPACE experiment of FIG. 22b, in which case the sequence will be reduced to the (self-refocusing) SR-SPACE sequence according to FIG. 23b. As in the case of the original versions of these experiments, the two new sequences are formally equivalent. Indeed, it is a mere matter of taste if the non-selective pulse is to be placed before or after the selective pulse. Presumably, it would be preferable to place the selective pulse as in FIG. 23a, as this leaves more time to the transverse magnetization for dephasing. These modifications should both improve the z magnetization profile and increase the sensitivity by reducing the dwelling time in the transverse plane.

If self-refocusing 270° Gaussian pulses are used for transforming $M_z$ to $M_{x,y}$, a small $M_y$ component which is antisymmetrical relative to the offset will be encountered, which may disturb the disk selection process in the case of inhomogeneous objects. The SR-SPACE experiment is not affected by this problem because the undesirable components remain unobservable, due to dephasing, in every stage of the experiment. Consequently, the undesirable residual $M_y$ components are fully filtered out from the experiments in this manner.

Figure 24:
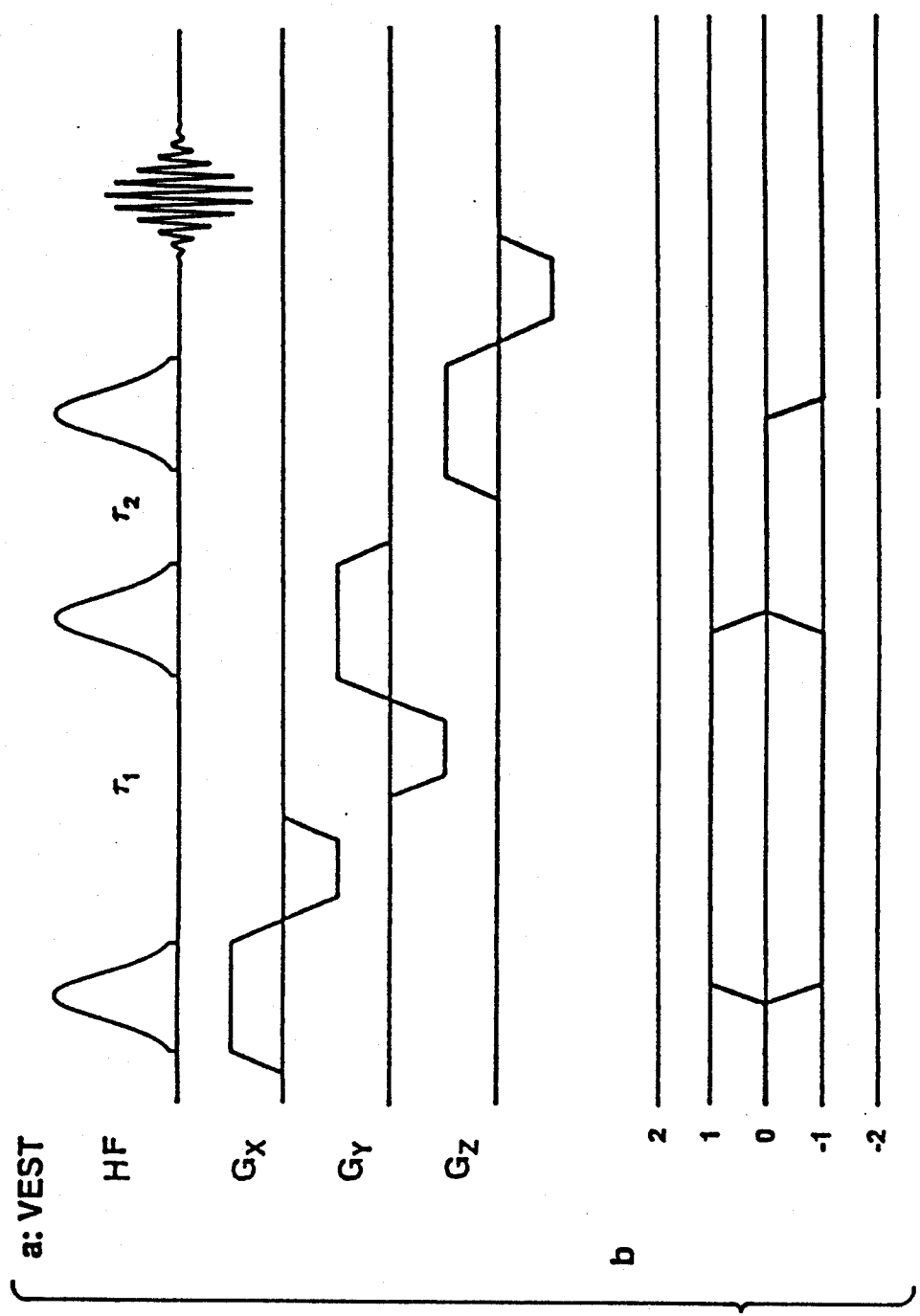
FIG. 24 shows
a) a pulse and field gradient diagram for selective volume excitation by stimulated echoes (VEST),
b) coherence transfer paths for the stimulated echoes.

In the case of the original VEST sequence illustrated in FIG. 24, the time delay $\tau_1$ must be at least as long as the time required for switching the gradient pulses. During this period of time, the relevant magnetization is in the transverse plane. In the case of the SR-VEST method according to FIG. 25a, where the usual 90° pulses are replaced by 270° Gaussian pulses, there is a necessity neither for refocusing nor for pre-defocusing gradient pulses, so that $\tau_1$ may be substantially equal to 0, which makes the sequence largely insensitive to $T_2$. During the $\tau_2$ delay, the selective magnetization gets oriented along the Z axis. Given the fact that in the SR experiment this delay may also be equal to 0, the sequence is also largely insensitive to $t_1$. In addition, it should be noted that the experiment now requires reduced technical input.

The price which has to be paid for these advantages is that it may be necessary to use more sophisticated phase cycles. In order to achieve good localization for the SR-VEST experiment, the first pulse is switched in fixed phase relationship to the receiver in order to ensure that the free induction decay following the third pulse will be suppressed. In order to achieve sufficient suppression of paths other than the one leading to the stimulated echo (see the coherence transfer paths of FIG. 24b), one may also insert a $\tau_2$ interval between the second and the third pulses, without any signal losses by $T_2$ relaxation, and extend the $G_y$ and $G_z$ gradients into this $\tau_2$ interval for the purpose of dephasing undesirable coherence. Alternatively, one may also make use of a 4-step phase cycle.

Figure 25:
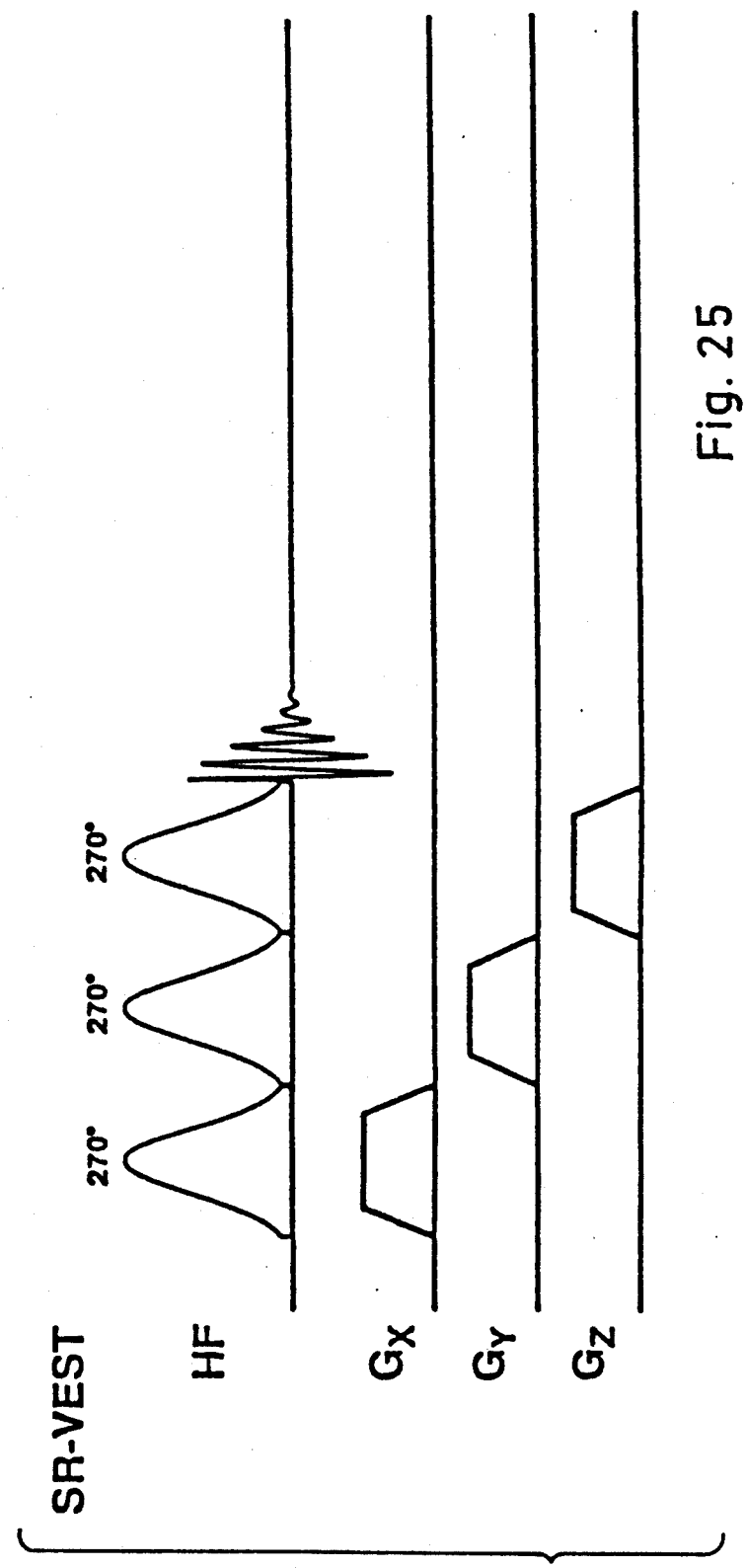
FIG. 25 shows a pulse and gradient diagram for self-refocusing VEST (=SR-VEST)

A point of particular interest is the similarities between the SR-SPARS sequence and the SR-VEST sequence according to FIGS. 23a and 25. The effects of these two sequences differ merely with respect to the trivial question where the selective magnetization is stored between the "building blocks" of the sequence. In the case of the SR-SPARS sequence, the magnetization is always stored along the Z axis of the rotating coordinate system, while in the case of the SR-VEST sequence the magnetization is stored along the $-x$, $-z$ and $+x$ axes.

On closer examination one finds that the hard 90° pulses used in SR-SPARS or SR-SPACE experiments for returning the magnetization to the z axis enable the sensitivity to rf inhomogeneities of the experiment to be minimized. It has been demonstrated in literature that the shape of the magnetization profile as produced by 270° Gaussian pulses is rather insensitive to rf inhomogeneity. However, if the sequences according to FIG. 23 or FIG. 25 were used blindly with nothing but rf pulses of the same phase, then the total flip angles to which the magnetization in the VOI would be subjected would sum up to 1170° or 810°, and the effects of the rf inhomogeneity would be cumulative. If, however, the SR-VEST sequence is modified in such a way that the phases of the three pulses according to FIG. 25 are $\pm y$, $+y$ and $-y$, then the total flip angle is reduced to an acceptable value of $\pm 270°$. This requirement is compatible with the phase cycle required for suppressing the free induction decay following the last pulse, but incompatible with the full phase-cycle requirements necessary for unambiguous selection of the coherence transfer paths, and in cases where rf inhomogeneity is a problem, the required suppression of other paths must be achieved by the application of gradients in the $\tau_2$ interval.

With respect to the SR-SPARS sequence, where each building block of the sequence comprises two pulses, we suggest to use the following phases:

$$90°_{+y} 270°_{-y} 90°_{-y} 270°_{+y} 90°_{+y} 270°_{-y} 90°_{+y}$$

One achieves in this manner a reduction of the total flip angle to 90°, and as no phase cycle requirements have to be fulfilled in the case of SR-SPARS, there should be nothing in the way of introducing this phase. Consequently, the SR-SPARS sequence with 270° pulses is no more sensitive to rf inhomogeneities than a normal sequence with 90° pulses, provided all diffusion effects can be neglected.

Figure 22:
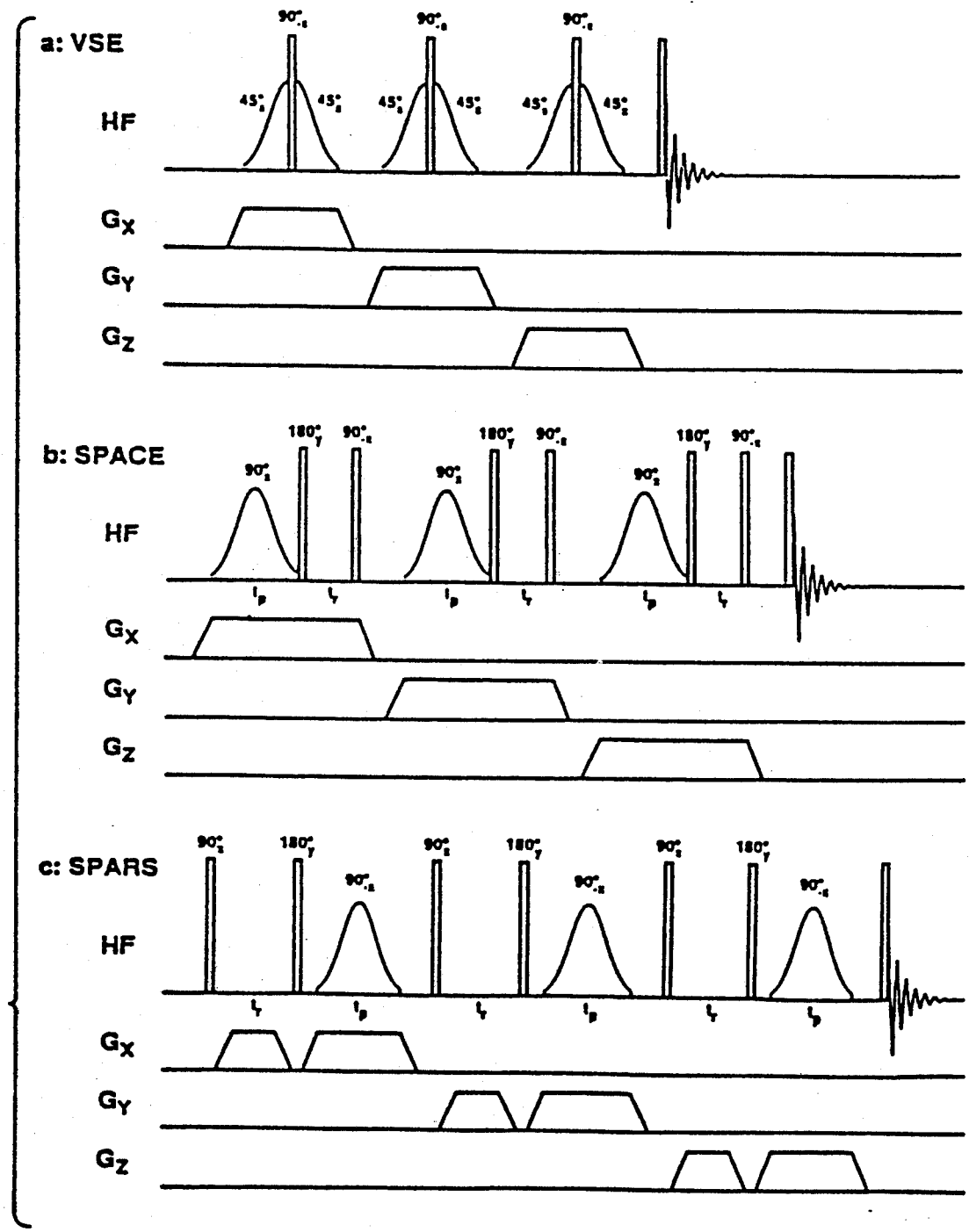
FIG. 22 shows pulse and field gradient diagrams for
a) volume-selective excitation (VSE)
b) spatially and chemical offset coded excitation (SPACE)
c) spatially resolved spectroscopy (SPARS), FIG. 23
a) self-refocusing SPARS (=SR-SPARS),
b) self-refocusing SPACE (=SR-SPACE)
Figure 23:
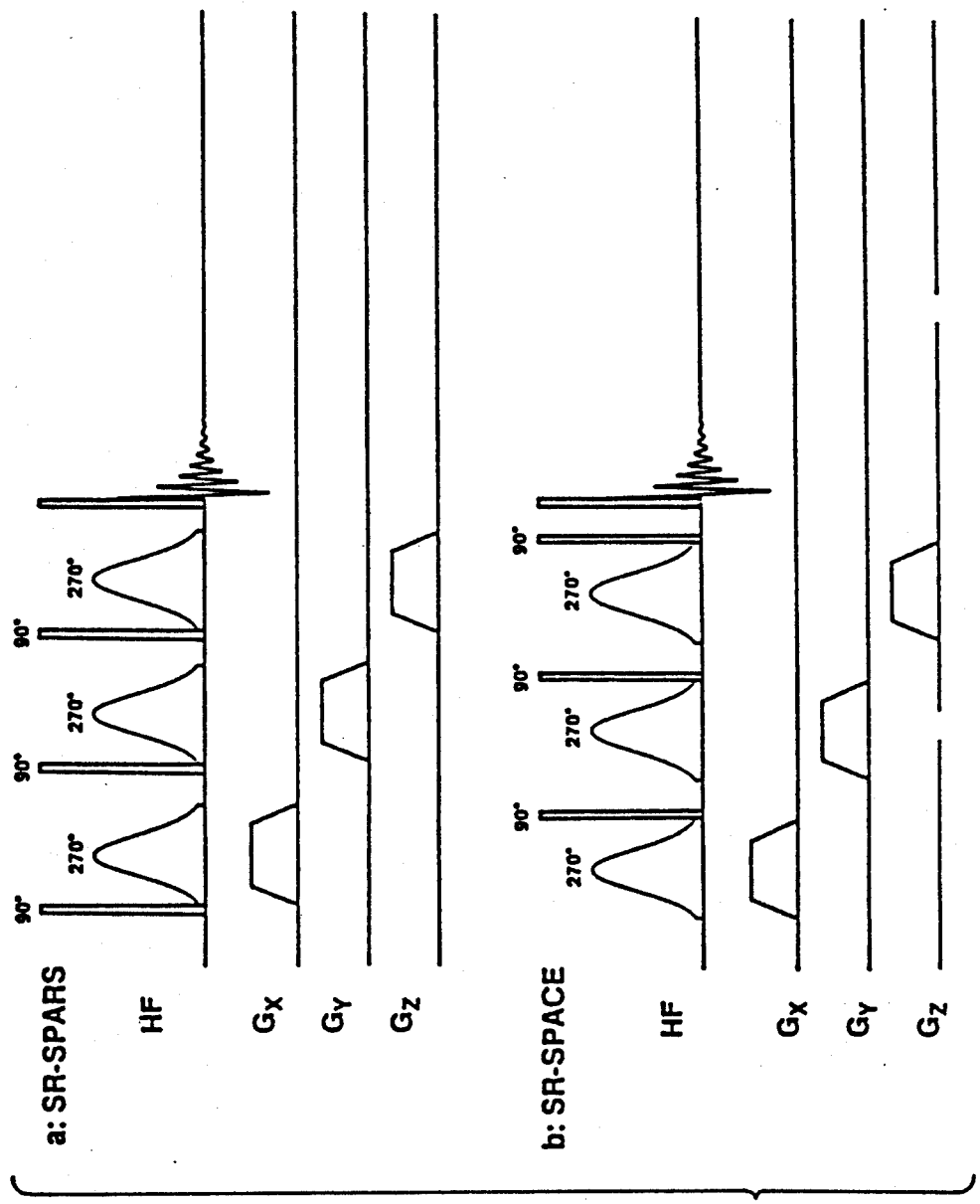

It is possible to quantify the effects of the relaxation on the original sequences of FIGS. 22 and 24, and on the self-refocusing sequences of FIGS. 23 and 25, by introducing a simple mono-exponential $T_2$ decay into the simulations of the Bloch equations, neglecting the effect of the longitudinal $T_1$ relaxation.

Our simulations show that when the sequence with gradient reversal according to FIG. 16b is used in a system with a $T_2$ relaxation time, the signal intensity, which is equal to the length $t_p$ of the (truncated) 90° Gaussian pulse, is reduced to only 30%. In contrast, when the sequence according to FIG. 16a is used and instantaneous gradient switching and the same relaxation time and the use of a self-refocusing 270° pulse are assumed, as much as 60% of the signal will be left. By eliminating the gradient-reversal step, one therefore achieves an improvement in sensitivity by the factor 2. A useful way to quantify the effects which the transverse relaxation has on different pulse sequences is to map out the signal intensity as a function of the non-dimensional relation $t_p/T_2$ (see FIG. 26). By inserting $t_p$ into the numerator the resulting curves (of the first order) are simply standardized with respect to selectivity. Although the decay incorporated into the Bloch equations was mono-exponential, the signal will normally decay according to a multi-exponential function. As it has been assumed that the transverse component only of the magnetization will decay and as this component is a continuously varying fraction of the total vector, each vector will relax during the pulse according to a multi-exponential function. In addition, every offset will have a different trajectory through the spinning space for a given pulse length, so that every offset will relax slightly differently as compared to the others, and this will lead to distortion of the resulting magnetization profile, due to transverse relaxation. Fortunately, however, this distortion is negligibly small for a 270° Gaussian pulse.

Figure 18C:
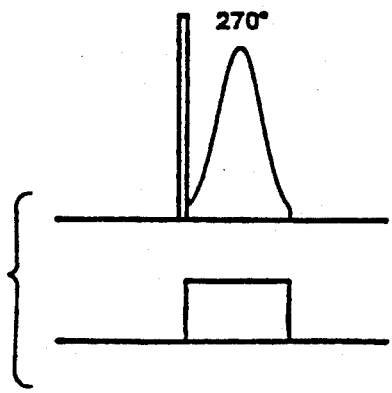
Figure 18F:
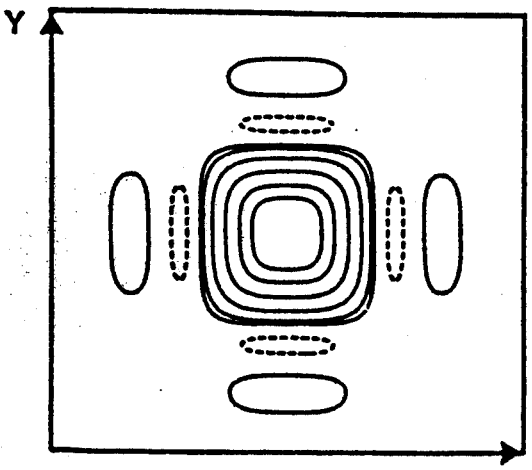
Figure 26A:
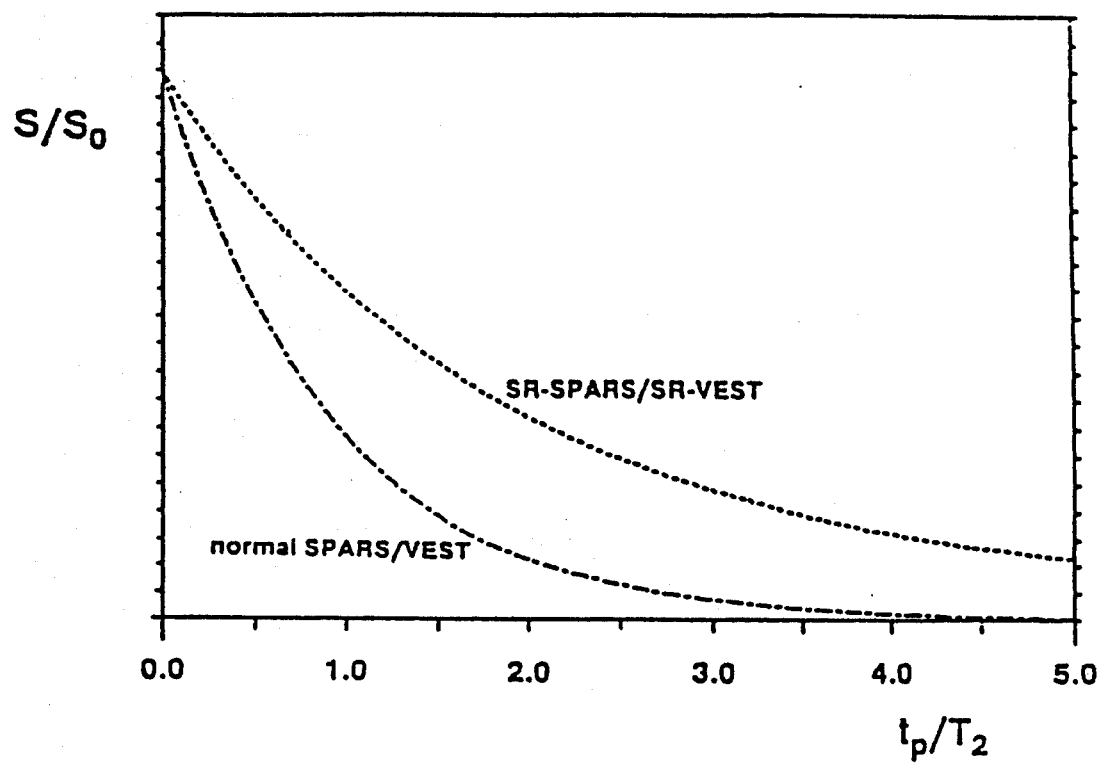
FIG. 26 shows the relative signal intensity $S/S_o$ as a function of the non-dimensional ratio $t_p/T_2$ of the Gaussian pulse length $t_p$ and the transverse relaxation time $T_2$.
Figure 26B:
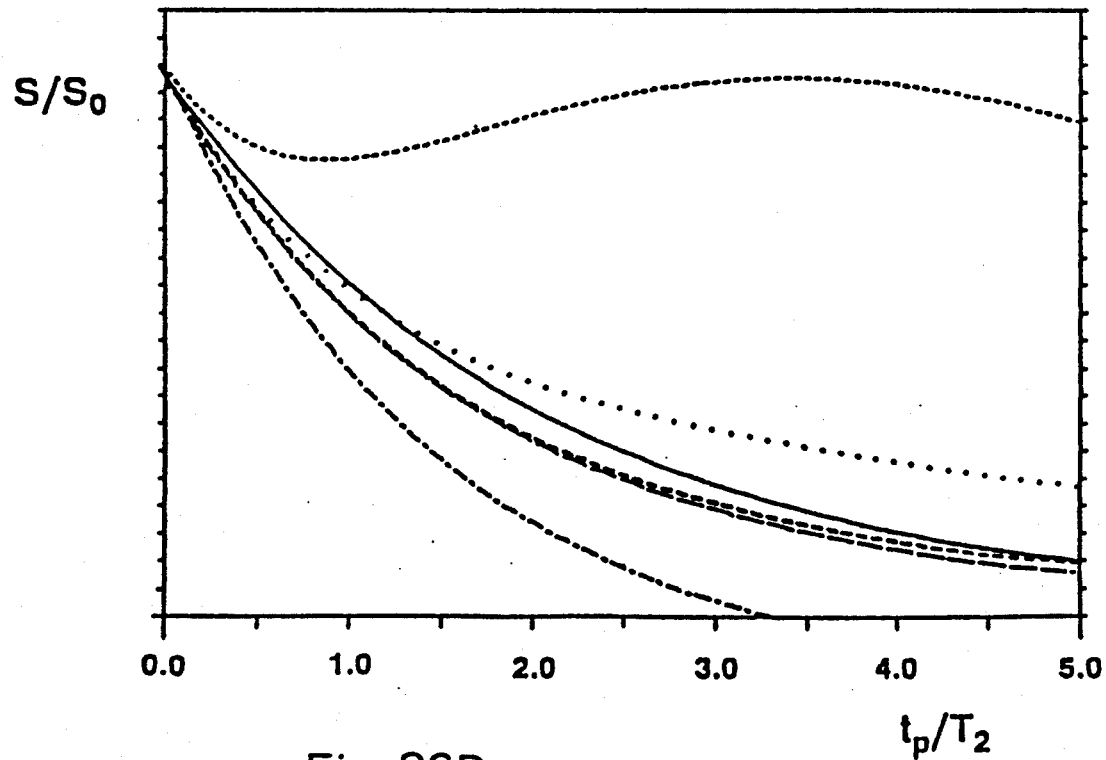

FIG. 26a shows a 90° Gaussian pulse with the scenario of FIG. 18a (dash-dotted line) and a 270° Gaussian pulse with the self-refocusing scenario of FIG. 18c (short-dashed line). The non-dimensional decay constants ("relaxation coefficients") of these curves, considering three-dimensional volume selection, are 3k=3.3 and 1.3, respectively. FIG. 26b shows the decay of different magnetization vectors for different offsets, under the scenario of FIG. 18c, as a function of $t_p/T_2$. The vectors have reduced offsets of 0, 0.15, 0.23, 0.35, 0.40 and 0.42.

The relaxation also leads to distortion of the magnetization trajectories, depending on $t_p/T_2$, so that each offset is also subjected to a multi-exponential decay which is a function of the relation $t_p/T_2$, as shown in FIG. 26b. Fortunately, however, FIG. 26a shows that the attenuation of the signal of the Gaussian pulses applied according to the diagrams of FIG. 16 behaves almost mono-exponentially. This seems to suggest that in a given experiment the decay may be described approximately by $$(S/S_0)_i = \exp\{-k_1 t_p/T_2\}. \quad [7]$$

The non-dimensional decay constant $k_1$, which we describe as "relaxation coefficient", provides a good measure of the sensitivity of a sequence to transverse relaxation. In fact, it can be regarded as a physical interpretation that a value of $k_1 = 1$ shows that the magnetization is weakened to the same extent as if it simply had remained in the transverse plane for the period $t_p$. The smaller the value of k, the lower the sensitivity of the sequence to relaxation and the higher its efficiency. The relaxation coefficients according to FIG. 26a are $k_1 = 1.1$ for sequences with a 90° Gaussian pulse according to FIG. 16b or 16c, and $k_1 = 0.43$ for sequences with a 270° Gaussian pulse according to FIG. 16a or 16d.

It is very easy to extend this analysis to three-dimensional localized spectroscopy sequences of the type mentioned before, all these sequences consisting substantially of three successive building blocks with gradients applied in three orthogonal directions. Consequently:

$$(S/S_0)_{3i} = \exp\{-3k_1 t_p/T_2\}. \quad [8]$$

And the relaxation coefficients of the three-dimensional experiments are simply those for the unidimensional building blocks, i.e. $3k_1 = 3.3$ for the normal SPARS and VEST sequences, and $3k_1 = 1.3$ for the related SR sequences. This shows very clearly the great advantage in sensitivity to relaxation which the self-refocusing sequences offer as compared to equivalent sequences which have been refocused with the aid of gradients. Indeed, a full three-dimensional SR sequence is by only 15% more sensitive to transverse relaxation than a single disk-selective 90° pulse according to FIG. 16b or FIG. 16c.

We have not given explicit consideration to the relaxation effect on the stimulated echo sequences with $\tau_1$ delays which are longer than the period necessary for gradient switching. However, it is clear that the sensitivity to relaxation rises simply as $\tau_1$ increases, which can be described by a modification of equation [8]:

$$(S/S_0)_{3i} = \exp\{(-3k_1 t_p + 2\tau_e)/T_2\} \quad [9]$$

wherein $\tau_e = \tau_1 - 2tr$. The factor 2 in equation [9] has been introduced in consideration of the fact that the magnetization will remain in the transverse plane during two $\tau_e$ delays. An extension of the length of the $\tau_2$ delays has no effect on the sensitivity so long as the longitudinal relaxation is neglected.

From the above it results that a 270° Gaussian pulse may be employed in all cases where heretofore selective 90° pulses, also in combination with measures for refocusing the transverse magnetization which had been dephased by the 90° pulse, have been used and that the use of such a 270° Gaussian pulse does away with the need for rephasing measures of an experimental or arithmetic nature.

We claim:

1. A method for selective excitation of NMR signal including the step of irradiating upon a sample, which is located within a homogeneous static magnetic field, an rf pulse sequence comprising at least one frequency-selective Gaussian pulse, wherein the at least one frequency-selective Gaussian pulse is a 270° pulse.

2. A method according to claim 1 using a NOESY pulse sequence, wherein at least one of the frequency-selective excitation pulses comprised in the NOESY pulse sequence is a 270° Gaussian pulse.

3. A method according to claim 1 employed in NMR tomography, using an image-generating pulse sequence, wherein at least one of the frequency-selective excitation pulses comprised in the image-generating pulse sequence is a 270° Gaussian pulse.

4. A method according to claim 1 for volume-selective NMR spectroscopy, using a volume-selective pulse sequence, wherein at least one of the frequency-selective excitation pulses comprised in the volume-selective pulse sequence is a 270° Gaussian pulse.

* * * * *

UNITED STATES PATENT AND TRADEMARK OFFICE
CERTIFICATE OF CORRECTION

PATENT NO. : 5,196,795
DATED : March 23, 1993
INVENTOR(S) : Geoffrey Bodenhausen and Lyndon Emsley It is certified that error appears in the above-identified patent and that said Letters Patent is hereby corrected as shown below:

Title page, [22] PCT Filed:, delete "Jul. 25, 1990" and insert -- Nov. 13, 1989 --.

Signed and Sealed this

Twenty-second Day of November, 1994

Attest:

BRUCE LEHMAN

*Attesting Officer*    *Commissioner of Patents and Trademarks*